United States Patent
Yasukawa et al.

(10) Patent No.: US 7,821,605 B2
(45) Date of Patent: Oct. 26, 2010

(54) ELECTRO-OPTICAL DEVICE AND ELECTRONIC APPARATUS

(75) Inventors: Masahiro Yasukawa, Chino (JP); Hitoya Nagasawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 79 days.

(21) Appl. No.: 12/190,365

(22) Filed: Aug. 12, 2008

(65) Prior Publication Data

US 2009/0065780 A1    Mar. 12, 2009

(30) Foreign Application Priority Data

Sep. 10, 2007    (JP)    ............... 2007-233696

(51) Int. Cl.
    *G02F 1/1343*    (2006.01)
(52) U.S. Cl. ............... 349/139; 349/56; 349/84; 349/149
(58) Field of Classification Search ............ 349/139, 349/149, 56, 84
    See application file for complete search history.

(56) References Cited

U.S. PATENT DOCUMENTS

| | | | |
|---|---|---|---|
| 7,362,304 B2* | 4/2008 | Takatori et al. | 345/103 |
| 2009/0051840 A1* | 2/2009 | Yasukawa | 349/39 |
| 2009/0080154 A1* | 3/2009 | Hirabayashi et al. | 361/690 |

FOREIGN PATENT DOCUMENTS

| | | |
|---|---|---|
| JP | 08-234239 | 9/1996 |
| JP | 2000-356787 | 12/2000 |
| JP | 3307144 | 7/2002 |
| JP | 2003-307725 | 10/2003 |
| JP | 2004-170656 | 6/2004 |
| JP | 2005-45017 | 2/2005 |
| JP | 2006-171136 | 6/2006 |

* cited by examiner

*Primary Examiner*—Jennifer Doan
(74) *Attorney, Agent, or Firm*—AdvantEdge Law Group, LLC

(57) ABSTRACT

An electro-optical device includes a contact hole with a channel-region adjacent portion next to the channel region of the semiconductor film and a first extending portion that extends from the channel-region adjacent portion along the first partial region of the semiconductor film when viewed in plan.

10 Claims, 14 Drawing Sheets

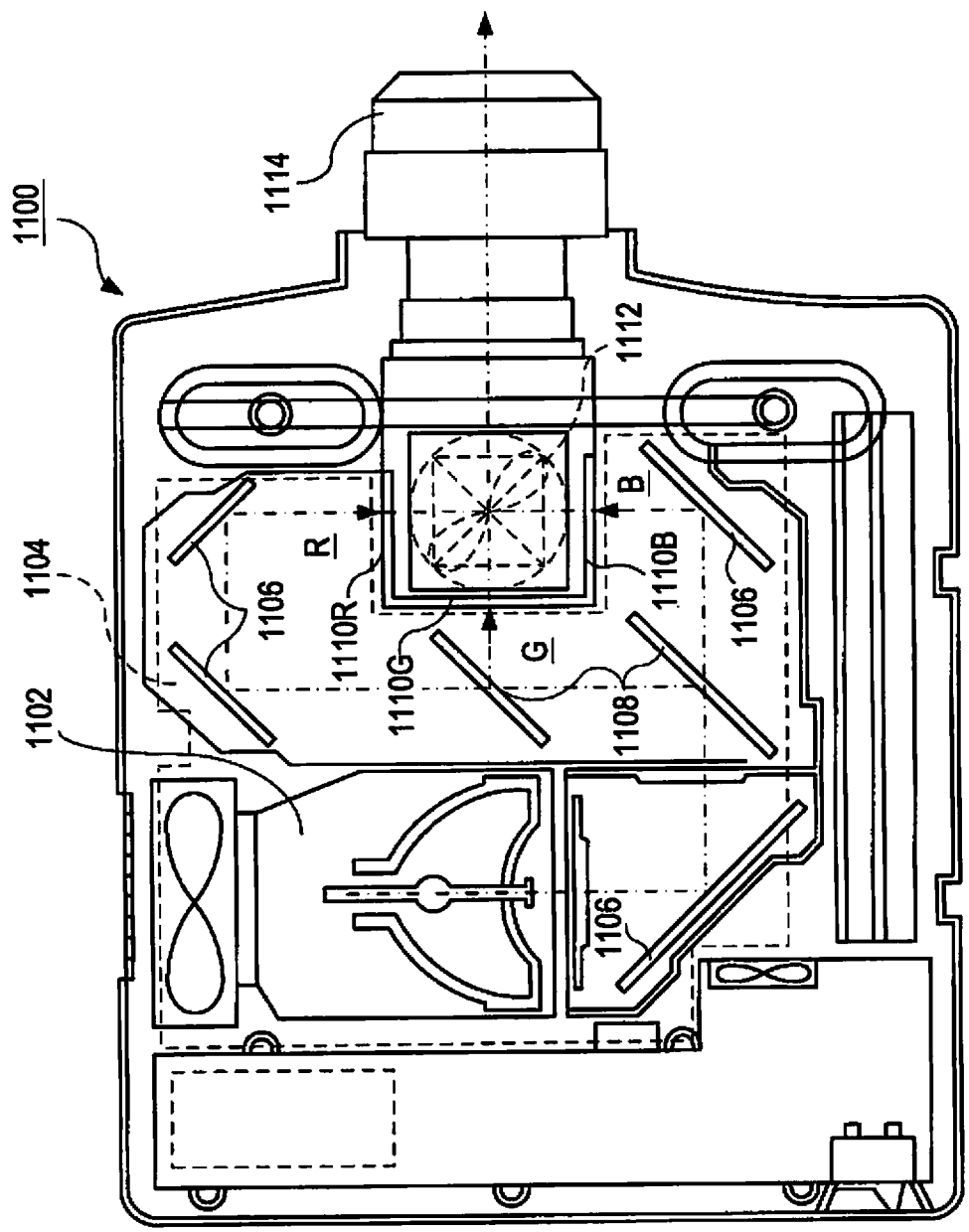

ELECTRO-OPTICAL DEVICE AND ELECTRONIC APPARATUS

BACKGROUND

1. Technical Field

The present invention relates to an electro-optical device such as a liquid crystal device or the like. In addition, the invention further relates to an electronic apparatus that is provided with an electro-optical device. An example of a variety of electronic apparatuses to which the invention can be applied includes but not limited to a liquid crystal projector.

2. Related Art

As a typical configuration example thereof, an electro-optical device of the related art has a plurality of data lines and a plurality of scanning lines that are formed so as to intersect with each other in an image display region (i.e., image display area) over a substrate. A plurality of pixel electrodes are arrayed in a matrix pattern in such a manner that each of the plurality of pixel electrodes is provided at a position corresponding to the intersection of the data line and the scanning line. Each of the plurality of pixel electrodes is switch-controlled on a pixel-by-pixel basis (i.e., for each pixel). Each of the plurality of pixels is provided with a transistor, which is an example of a pixel-switching element that controls the corresponding one of the plurality of pixel electrodes. Each of the plurality of pixel-switching transistors has a lightly doped drain structure, which is hereafter abbreviated as an LDD structure.

An electro-optical device of the related art that is described in JP-A-2005-45017 is provided with a lower light-shielding film. The lower light-shielding film, which is formed over a substrate at a layer under the transistor, shuts off an incident light beam that enters and propagates toward the semiconductor film of the transistor through a lower layer(s) that is provided below the semiconductor film of the transistor. Another electro-optical device of the related art that is described in Japanese Patent No. 3,307,144 is provided with an upper light-shielding film. The upper light-shielding film, which is formed over a substrate at a layer over the transistor, shuts off an incident light beam that enters and propagates toward the semiconductor film of the transistor through upper layers that are provided above the semiconductor film of the transistor. Each of the related-art electro-optical devices described in JP-A-2005-45017 and Japanese Patent No. 3,307,144 has a disadvantage in that it has relatively weak light-shielding protection/structure against light that enters and propagates toward the side of the LDD regions of a semiconductor layer, or, in other words, lateral light that enters and propagates toward the LDD regions of a semiconductor layer. Because of such vulnerability to lateral light, each of the related-art electro-optical devices described in JP-A-2005-45017 and Japanese Patent No. 3,307,144 is susceptible to the occurrence of an optical leakage current, which should be avoided.

In an effort to provide a technical solution to such a problem, in the technical field to which the present invention pertains, a technique for shutting off lateral light that enters and propagates toward (the side of) the LDD regions of a semiconductor layer has been proposed so far. An example of a related-art technique for shutting off such a laterally-propagating light beam is disclosed in the following publications, each of which is directed to an electro-optical device that uses LDD transistors: JP-A-2000-356787, JP-A-2004-170656, JP-A-2006-171136, and JP-A-2003-307725. Specifically, in the light-shielding structure of a transistor of the related art described in JP-A-2000-356787, JP-A-2004-170656, JP-A-2006-171136, and JP-A-2003-307725, a contact hole is formed at each side of a semiconductor film along a channel region and LDD regions thereof when viewed in plan. An electro-conductive film (i.e., conductive film) that has light-shielding property is formed in the contact hole. The electro-conductive film that is formed inside the contact hole, or at least the inner-contact-hole portion thereof, is made of the same material and in the same single film formation process as that of, for example, a gate electrode. The electro-conductive film that is formed inside the contact hole makes it possible to shut off a lateral light beam, which enters and propagates toward the side of the LDD regions of a semiconductor layer as well as toward the channel region thereof.

The semiconductor film of an LDD-structure transistor has highly-doped (i.e., high concentration) impurity regions in addition to the LDD regions and the channel region mentioned above. As a typical layout thereof, the channel region is interposed between one of the LDD regions and the other thereof. The LDD-chanel-LDD region explained above is further interposed between one of the highly doped impurity regions and the other. The above-mentioned one of the highly doped impurity regions is electrically connected to a data line, whereas the above-mentioned other thereof is electrically connected to a pixel electrode.

The light-shielding structure of a transistor of the related art described in JP-A-2000-356787, JP-A-2004-170656, and JP-A-2006-171136 has a technical problem in that it is difficult to shut off a lateral incident light beam that enters and propagates toward the side of the electric-connection portion of each of the data-line-side highly doped impurity region and the pixel-electrode-side highly doped impurity region. Herein, the above-mentioned electric-connection sub region of the data-line-side highly doped impurity region is electrically connected to a data line, whereas the above-mentioned electric-connection sub region of the pixel-electrode-side highly doped impurity region is electrically connected to a pixel electrode. There is a relatively greater possibility of the occurrence of an optical leakage current in the pixel-electrode-side LDD region of the semiconductor layer of an LDD transistor than in the data-line-side LDD region thereof. For this reason, any lateral incident light beam that enters and propagates toward the side of the electric-connection sub region of the pixel-electrode-side highly doped impurity region might be irradiated to the pixel-electrode-side LDD region of the semiconductor layer of the LDD transistor, which is more susceptible to an optical leakage current. As a result thereof, the operation failure of the transistor might occur.

The light-shielding structure of a transistor of the related art described in JP-A-2003-307725 makes it possible to shut off a lateral incident light beam that enters and propagates toward the side of the electric-connection portion of each of the data-line-side highly doped impurity region and the pixel-electrode-side highly doped impurity region. However, in the light-shielding structure of a transistor of the related art described in JP-A-2003-307725, an extra light-shielding film that is formed at a layer different from that of a gate electrode extends into a contact hole. That is, in the light-shielding structure of a transistor of the related art described in JP-A-2003-307725, the inner-contact-hole portion of such an extra light-shielding film, which is not the same single layer as the gate electrode, shuts off a lateral incident light beam. For this reason, the light-shielding structure of a transistor of the related art described in JP-A-2003-307725 has a technical disadvantage in that it requires more complex manufacturing process.

SUMMARY

An advantage of some aspects of the invention is to provide an electro-optical device that is capable of effectively preventing or reducing the occurrence of an optical leakage current in a transistor that has an LDD structure without requiring any complex light-shielding structure. In addition, the invention further provides, as an advantage of some aspects thereof, an electronic apparatus that is provided with such an electro-optical device.

In order to address the above-identified problem without any limitation thereto, the invention provides, as a first aspect thereof, an electro-optical device that includes: a substrate; a plurality of data lines and a plurality of scanning lines that intersect with each other in a display area over the substrate; a plurality of pixel electrodes each of which is formed at a position corresponding to an intersection formed by the data line and the scanning line; and a plurality of transistors each of which includes a semiconductor film and a gate electrode, the semiconductor film of the transistor being formed at a layer that is distanced from the scanning line with an interlayer insulation film being interposed between the semiconductor film of the transistor and the scanning line, the semiconductor film of the transistor having a channel region that has a channel length along one direction in the display area, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region, the gate electrode of the transistor being formed at a greater distance from the scanning line than a distance between the semiconductor film of the transistor and the scanning line, the gate electrode of the transistor overlapping the channel region, wherein a contact hole is formed through the interlayer insulation film; the gate electrode is electrically connected to the scanning line via the contact hole; the contact hole has a channel-region adjacent portion that is formed next to the channel region of the semiconductor film and further has a first extending portion that extends from the channel-region adjacent portion along a first partial region of the semiconductor film when viewed in plan over the substrate; the first partial region of the semiconductor film includes the second junction region and a first connecting portion of the pixel-electrode-side source/drain region; and the first connecting portion of the pixel-electrode-side source/drain region is electrically connected to the pixel electrode.

In the configuration of an electro-optical device according to the first aspect of the invention described above, an image signal supplied through a data line to a pixel electrode is controlled for each pixel, thereby making it possible to perform image display conforming to a so-called active matrix scheme. An image signal is supplied from the data line to the pixel electrode via a transistor at a predetermined timing as the transistor is turned ON/OFF in accordance with a scanning signal that is supplied thereto through a scanning line. The transistor serves as a switching element that is electrically connected between the data line and the pixel electrode. A plurality of pixel electrodes is provided in a matrix arrangement pattern in a region that functions as a display area over the substrate. In such a matrix array pattern, each of the pixel electrodes is provided at a position that corresponds to an intersection of the data line and the scanning line.

The transistor has a semiconductor film (i.e., semiconductor layer) that includes a channel region, a data-line-side source/drain region, and a pixel-electrode-side source/drain region. In addition, the transistor has a gate electrode that overlaps the channel region.

The channel region has a channel length along one direction in a display area. The term "one direction" according to an aspect of the invention means either a row direction of a plurality of pixels arrayed in a matrix pattern over a substrate, that is, a data-line arrangement direction in which a plurality of data lines are arrayed adjacent to one another or, in other words, a scanning-line extension direction in which each of a plurality of scanning lines extends (i.e., the X direction), or a column direction of the plurality of pixels arrayed in the matrix pattern over the substrate, that is, a scanning-line arrangement direction in which the plurality of scanning lines are arrayed adjacent to one another or, in other words, a data-line extension direction in which each of the plurality of data lines extends (i.e., the Y direction).

The data-line-side source/drain region and the data line are electrically connected to each other. The pixel-electrode-side source/drain region and the pixel electrode are electrically connected to each other. In addition, a first junction region is formed between the channel region of the semiconductor film and the data-line-side source/drain region thereof, whereas a second junction region is formed between the channel region of the semiconductor film and the pixel-electrode-side source/drain region thereof. Assuming that the transistor has an LDD structure, though not necessarily limited thereto, each of the first junction region and the second junction region is formed as an LDD region. That is, each of the first junction region and the second junction region is formed as an impurity region that is formed by implanting impurities into the semiconductor film by using, for example, an ion implantation method, or other similar alternative technique. The amount of impurities implanted into each of the first junction region and the second junction region is relatively small in comparison with the amount of impurities implanted into each of the data-line-side source/drain region and the pixel-electrode-side source/drain region. Each of the data-line-side source/drain region and the pixel-electrode-side source/drain region is formed as a highly doped impurity region that is higher in impurity concentration than the LDD regions.

The transistor is formed in a certain layer that is not the same as the layer of the scanning line. As a non-limiting layer/lamination structure of an electro-optical device according to the first aspect of the invention described above, the transistor is formed above the scanning line. An interlayer insulation film is formed between the transistor and the scanning line. The scanning line is formed in such a manner that the scanning line and the semiconductor film of the transistor overlap each other when viewed in plan over the substrate. With such a light-shielding structure, it is possible to shut off an incident light beam that enters and propagates toward the semiconductor film of the transistor through a lower layer(s) that is provided below the semiconductor film of the transistor.

As viewed in three dimensions, the gate electrode is formed at a certain layer that lies near (though not necessarily limited thereto) one face of the semiconductor film that is opposite to the other scanning-line-formation face thereof, which is the side at which the scanning line is formed. For example, the gate electrode is formed in a layer over the semiconductor film whereas the scanning line is formed in a layer under the semiconductor film, though not necessarily limited thereto. The scanning line and the gate electrode are electrically connected to each other via a contact hole that is formed through the interlayer insulation film. The contact hole has a channel-region adjacent portion that is formed next to the channel region of the semiconductor film when viewed in plan over the substrate. The contact hole further has a first extending portion that extends from the channel-region adjacent portion thereof in a plan view. An electro-conductive film, or at least a part thereof, is formed inside the contact hole. The scanning line and the gate electrode are electrically connected to each other through the conductive film that is formed inside the contact hole. For example, the gate electrode is formed in such a manner that it extends from the channel-region-overlapping area (i.e., from over the channel region of the semiconductor film) into the channel-region adjacent portion of the contact hole, which is formed next to the channel region of the semiconductor film. The inner-hole portion of the gate electrode is in contact with a partial surface of the scanning line that is exposed in/through the contact hole.

In the configuration of an electro-optical device according to the first aspect of the invention described above, the channel-region adjacent portion of the contact hole is formed next to the channel region of the semiconductor film. In addition, a part of the electro-conductive film is formed inside the channel-region adjacent portion of the contact hole. With such a light-shielding structure, the above-mentioned part of the electro-conductive film that is formed inside the channel-region adjacent portion of the contact hole makes it possible to at least partially shut off a lateral incident light beam that enters and propagates toward the side of the channel region of the semiconductor film. In the configuration of an electro-optical device according to the first aspect of the invention described above, the first extending portion of the contact hole extends from the channel-region adjacent portion thereof along a first partial region of the semiconductor film when viewed in plan over the substrate. The first partial region of the semiconductor film has a pixel-electrode-side LDD region, which is a non-limiting example of the second junction region. In addition, the first partial region of the semiconductor film further has the first connecting portion of the pixel-electrode-side source/drain region. The first connecting portion of the pixel-electrode-side source/drain region is electrically connected to the pixel electrode. More specifically, the first connecting portion of the pixel-electrode-side source/drain region is electrically connected to a relay electro-conductive film that is electrically connected to the pixel electrode. The electro-conductive film is formed at a certain layer above the semiconductor film with either a single interlayer insulation film or plural interlayer insulation films being formed between the semiconductor film and the electro-conductive film. A contact hole is formed through the interlayer insulation film(s). This means that the first connecting portion of the pixel-electrode-side source/drain region is electrically connected to the electro-conductive film via the contact hole that is formed through the interlayer insulation film(s). Or, in other words, the first connecting portion of the pixel-electrode-side source/drain region is a sub region at which the contact hole, which is formed through the interlayer insulation film(s) for providing electric connection between the pixel-electrode-side source/drain region and the electro-conductive film (the pixel electrode), is provided. In the configuration of an electro-optical device according to the first aspect of the invention described above, the first extending portion of the contact hole extends from the channel-region adjacent portion thereof along (e.g., adjacent to) the first partial region of the semiconductor film when viewed in plan over the substrate. With such a light-shielding structure, a part of the electro-conductive film that is formed inside the first extending portion of the contact hole makes it possible to at least partially shut off a lateral incident light beam that enters and propagates toward the side of the first partial region of the semiconductor film.

As explained above, an electro-optical device according to the first aspect of the invention has a contact hole that has the channel-region adjacent portion and the first extending portion. Therefore, it is possible to shut off a lateral incident light beam that enters and propagates toward the side of the second junction region of the semiconductor film, which is more susceptible to an optical leakage current than the first junction region, in addition to light-shielding protection against an incident light beam that enters and propagates toward the second junction region of the semiconductor film through a lower layer(s) formed under the second junction region of the semiconductor film or through upper layers formed over the second junction region of the semiconductor film. Moreover, if the configuration of an electro-optical device according to the first aspect of the invention is adopted, it is possible to shut off a lateral incident light beam that enters and propagates toward the side of the pixel-electrode-side source/drain region of the semiconductor film in addition to light-shielding protection against an incident light beam that enters and propagates toward the pixel-electrode-side source/drain region of the semiconductor film through a lower layer(s) formed under the pixel-electrode-side source/drain region of the semiconductor film or through upper layers formed over the pixel-electrode-side source/drain region of the semiconductor film, thereby making it further possible to prevent such light from being irradiated to the second junction region of the semiconductor film. It should be particularly noted that the first extending portion of the contact hole extends along the first partial region of the semiconductor film through a region adjacent to the first connecting portion of the pixel-electrode-side source/drain region. With such a light-shielding structure, it is possible to at least partially shut off a lateral incident light beam that enters and propagates toward the first connecting portion of the pixel-electrode-side source/drain region, thereby making it further possible to prevent, with increased reliability, any irradiation of light to the second junction region of the semiconductor film.

Therefore, an electro-optical device according to the first aspect of the invention described above makes it possible to effectively prevent or reduce the occurrence of an optical leakage current in a transistor that has an LDD structure. As a result thereof, it is possible to avoid any display failure from occurring due to the malfunction of a transistor or due to flickers, though not limited thereto. Thus, an electro-optical device according to the first aspect of the invention described above features enhanced display quality.

Furthermore, in the configuration of an electro-optical device according to the first aspect of the invention described above, a portion of the gate electrode is formed inside the contact hole. Because of such a structure, it is not necessary to provide any extra/additional light-shielding film other than the above-mentioned inner-contact-hole portion of the gate electrode so as to shut off lateral light that propagates toward the side of the semiconductor film. Therefore, it is possible to provide an effective light-shielding structure so as to optically protect the transistor without requiring any complex structure. Therefore, in comparison with the light-shielding structure of the aforementioned related art that is described in, for example, JP-A-2003-307725, the above-explained light-shielding structure according to the first aspect of the invention makes it possible to simplify the manufacturing process of an electro-optical device.

In the configuration of an electro-optical device according to the first aspect of the invention described above, it is preferable that, when viewed in plan over the substrate, the first extending portion of the contact hole should extend from one side area adjacent to the semiconductor film to the other opposite side area adjacent to the semiconductor film so as to substantially surround the first partial region of the semiconductor film.

In the preferred configuration of an electro-optical device according to the first aspect of the invention described above, the channel-region adjacent portion of the contact hole is formed next to the channel region of the semiconductor film at each side thereof when viewed in plan over the substrate. The first extending portion of the contact hole extends from the channel-region adjacent portion thereof. The first extending portion of the contact hole extends from one side area adjacent to the semiconductor film to the other opposite side area adjacent thereto. Accordingly, when viewed in plan over the substrate, the first extending portion of the contact hole is formed around a part of the semiconductor film so as to partially surround the semiconductor film. Therefore, when viewed in plan over the substrate, the first extending portion of the contact hole extends from one side area adjacent to the semiconductor film to the other opposite side area adjacent thereto so as to surround the first partial region of the semiconductor film.

With such a light-shielding structure, a portion of the gate electrode that is formed inside the channel-region adjacent portion of the contact hole makes it possible to at least partially shut off, at each side of the semiconductor film, a lateral incident light beam that enters and propagates toward the side of the channel region of the semiconductor film. Moreover, because of such a light-shielding structure, a portion of the gate electrode that is formed inside the first extending portion of the contact hole makes it possible to at least partially shut off, at each side of the semiconductor film, a lateral incident light beam that enters and propagates toward the side of the second junction region of the semiconductor film. Furthermore, because of such a light-shielding structure, a portion of the gate electrode that is formed inside the first extending portion of the contact hole makes it possible to shut off any lateral incident light beam that enters and propagates toward the side of the pixel-electrode-side source/drain region of the semiconductor film. A part of the first extending portion of the contact hole is formed around the first connecting portion of the pixel-electrode-side source/drain region of the semiconductor film. With such a structure, it is possible to shut off any incident light beam that could otherwise reach the side of the first connecting portion of the pixel-electrode-side source/drain region of the semiconductor film throughout a wider light-shielding area, thereby offering enhanced light-shielding protection in a reliable manner.

In the configuration of an electro-optical device according to the first aspect of the invention described above, it is preferable that the gate electrode should have a gate-electrode main portion that overlaps the channel region of the semiconductor film and a gate-electrode extending portion that extends from the gate-electrode main portion in such a manner that a part of the gate-electrode extending portion of the gate electrode is formed inside the contact hole.

In the preferred configuration of an electro-optical device according to the first aspect of the invention described above, a portion of the gate electrode is formed inside the contact hole. Because of such a structure, it is not necessary to provide any extra/additional light-shielding film other than the above-mentioned inner-contact-hole portion of the gate electrode so as to shut off lateral light that propagates toward the side of the semiconductor film. Therefore, it is possible to provide an effective light-shielding structure so as to optically protect the transistor without requiring any complex structure.

In the preferred configuration of an electro-optical device according to the first aspect of the invention described above, the gate-electrode main portion is a part of the gate electrode that performs its original function (as a gate electrode). The gate-electrode extending portion of the gate electrode is electrically connected to the scanning line. The gate-electrode extending portion of the gate electrode extends throughout the channel-region adjacent portion of the contact hole and the first extending portion thereof.

In the configuration of an electro-optical device according to the first aspect of the invention described above, it is preferable that the contact hole should have, in addition to the channel-region adjacent portion and the first extending portion, a second extending portion that extends from the channel-region adjacent portion along a second partial region of the semiconductor film when viewed in plan over the substrate; the second partial region of the semiconductor film should include the first junction region and a second connecting portion of the data-line-side source/drain region; and the second connecting portion of the data-line-side source/drain region should be electrically connected to the data line.

In the preferred configuration of an electro-optical device according to the first aspect of the invention described above, when viewed in plan over the substrate, the contact hole extends from the channel-region adjacent portion thereof toward the data-line connection side of the semiconductor film, which is electrically connected to the data line. The data-line connection side of the semiconductor film is positioned at the other (directional) side that is opposite to the first-extending-portion side thereof as viewed from the channel-region adjacent portion thereof. Specifically, the contact hole has the first extending portion explained above, which extends from the channel-region adjacent portion thereof in one direction and further has the second extending portion, which extends from the channel-region adjacent portion thereof in the other opposite direction. The second extending portion of the contact hole is formed in such a manner that it extends from the channel-region adjacent portion thereof along a second partial region of the semiconductor film. The second partial region of the semiconductor film has a data-line-side LDD region, which is a non-limiting example of the first junction region. In addition, the second partial region of the semiconductor film further has the second connecting portion of the data-line-side source/drain region. The second connection portion of the data-line-side source/drain region is electrically connected to the data line.

In the preferred configuration of an electro-optical device according to the first aspect of the invention described above, the second extending portion of the contact hole extends from the channel-region adjacent portion thereof along (e.g., adjacent to) the second partial region of the semiconductor film when viewed in plan over the substrate. With such a light-shielding structure, a part of the electro-conductive film that is formed inside the second extending portion of the contact hole makes it possible to at least partially shut off a lateral incident light beam that enters and propagates toward the side of the second partial region of the semiconductor film. Therefore, it is possible to shut off a lateral incident light beam that enters and propagates toward the side of the second junction region of the semiconductor film in addition to the first junction region thereof. Since the second extending portion of the contact hole extends along the second partial region of the semiconductor film through a region adjacent to the second connecting portion of the data-line-side source/drain region of the semiconductor film. With such a light-shielding structure, it is possible to at least partially shut off a lateral incident light beam that enters and propagates toward the side of the second connecting portion of the data-line-side source/drain region of the semiconductor film in addition to the first connecting portion of the pixel-electrode-side source/drain region thereof.

As explained above, in the preferred configuration of an electro-optical device according to the first aspect of the invention described above, the second extending portion of the contact hole extends from the channel-region adjacent portion thereof in such a manner that the channel-region adjacent portion thereof is interposed between the first extending portion thereof and the second extending portion thereof. With such a structure, it is possible to shut off any incident light beam that could otherwise reach the side of the second connecting portion of the data-line-side source/drain region of the semiconductor film throughout a wider light-shielding area, thereby offering enhanced light-shielding protection. Therefore, it is possible to shut off or substantially reduce a lateral incident light beam that enters and propagates toward the side of the semiconductor film.

In the above-described preferred configuration of an electro-optical device that has the second extending portion of the contact hole, it is further preferable that, when viewed in plan over the substrate, the second extending portion should be formed next to the semiconductor film at each side thereof.

With such a preferred structure, it is possible to shut off, at each side of the second partial region of the semiconductor film, a lateral incident light beam that enters and propagates toward the side of the second partial region of the semiconductor film when viewed in plan over the substrate. Therefore, it is possible to shut off a lateral incident light beam that enters and propagates toward the second connecting portion of the data-line-side source/drain region of the semiconductor film at each side thereof in addition to a lateral incident light beam that enters and propagates toward the first junction region of the semiconductor film at each side thereof. Since the second extending portion of the contact hole is formed next to the semiconductor film at each side thereof, a portion of the gate electrode (e.g., a part of the gate-electrode extending portion thereof) that is formed inside the second extending portion of the contact hole makes it possible to shut off or substantially reduce, at each side of the semiconductor film, a lateral incident light beam that enters and propagates toward the second partial region of the semiconductor film, which includes the first junction region of the semiconductor film and the second connecting portion of the data-line-side source/drain region of the semiconductor film.

In the preferred configuration of an electro-optical device described above in which the second extending portion of the contact hole is formed next to the semiconductor film at each side thereof, it is further preferable that, when viewed in plan over the substrate, the second extending portion of the contact hole should extend from one side area adjacent to the semiconductor film to the other opposite side area adjacent to the semiconductor film so as to substantially surround the second partial region of the semiconductor film.

If such a preferred structure is adopted, a portion of the gate electrode that is formed inside the second extending portion of the contact hole makes it possible to shut off any lateral incident light beam that enters and propagates toward the side of the data-line-side source/drain region of the semiconductor film. A part of the second extending portion of the contact hole is formed around the second connecting portion of the data-line-side source/drain region of the semiconductor film. With such a structure, it is possible to shut off any incident light beam that could otherwise reach the side of the second connecting portion of the data-line-side source/drain region of the semiconductor film throughout a wider light-shielding area, thereby offering enhanced light-shielding protection in a reliable manner.

It is preferable that the electro-optical device according to the first aspect of the invention described above should further include a plurality of storage capacitors each of which has a lower capacitor electrode and an upper capacitor electrode that are formed opposite to each other with a dielectric film being interposed between the lower capacitor electrode and the upper capacitor electrode, wherein the storage capacitor is formed at a layer different from the layer of the transistor at the gate-electrode formation side as viewed from the semiconductor film.

In the preferred configuration of an electro-optical device according to the first aspect of the invention described above, the storage capacitor is formed above the transistor, though not limited thereto. The storage capacitor and the pixel electrode are electrically connected to the transistor. Specifically, the storage capacitor and the pixel electrode are connected thereto in electrically parallel with each other. Each of the storage capacitors is a capacitive element that functions as a hold capacitor or a retention volume for temporally holding the electric potential of the corresponding one of the pixel electrodes 9a in accordance with the supply of an image signal. The storage capacitor improves the electric potential retention property at the pixel electrode 9a. Therefore, it is possible to improve display characteristics, which could be perceived as enhanced contrast and/or reduced flickers.

If at least a portion of the lower capacitor electrode or a portion of the upper capacitor electrode is made of a conductive material that has light-shielding characteristics, it is possible to shut off an incident light beam that enters and propagates toward the semiconductor film of the transistor through upper layers that are formed above the semiconductor film of the transistor.

In the preferred configuration of an electro-optical device described above that has the storage capacitor, it is further preferable that at least one of the lower capacitor electrode and the upper capacitor electrode should be made of an electro-conductive material having light-shielding property.

If so configured, it is possible to shut off an incident light beam that enters and propagates toward the semiconductor film of the transistor through upper layers that are provided above the semiconductor film of the transistor. Specifically, it is possible to shut off an incident light beam that enters and propagates toward the channel region of the semiconductor film of the transistor, the second junction region thereof, the first connecting portion of the pixel-electrode-side source/drain region thereof, and the first junction region thereof through upper layers that are provided above the semiconductor film of the transistor.

In the preferred configuration of an electro-optical device described above in which at least one of the lower capacitor electrode and the upper capacitor electrode is made of an electro-conductive material having light-shielding property, it is preferable that at least one of the lower capacitor electrode and the upper capacitor electrode should at least partially cover the first partial region.

With such a light-shielding structure, it is possible to shut off an incident light beam that enters and propagates toward the first partial region of the semiconductor film, which includes the second junction region and the first connecting portion of the pixel-electrode-side source/drain region, through upper layers that are formed above the semiconductor film of the transistor.

In order to address the above-identified problem without any limitation thereto, the invention provides, as a second aspect thereof, an electronic apparatus that is provided with an electro-optical device according to the first aspect of the invention, which has any of the configurations described above, including its preferred or modified configurations.

According to an electronic apparatus of this aspect of the invention, it is possible to embody various kinds of electronic devices that are capable of providing a high-quality image display, including but not limited to, a projection-type display device, a mobile phone, an electronic personal organizer, a word processor, a viewfinder-type video tape recorder, a direct-monitor-view-type video tape recorder, a workstation, a videophone, a POS terminal, a touch-panel device, and so forth, because the electronic apparatus of this aspect of the invention is provided with the electro-optical device according to the above-described aspect of the invention.

These and other features, operations, and advantages of the present invention will be fully understood by referring to the following detailed description of exemplary embodiments in conjunction with the accompanying drawings.

BRIEF DESCRIPTION OF THE DRAWINGS

The invention will be described with reference to the accompanying drawings, wherein like numbers reference like elements.

FIG. 15 is a plan view that schematically illustrates an example of the configuration of a projector, which is an example of electronic apparatuses to which a liquid crystal device according to an exemplary embodiment of the invention is applied.

DESCRIPTION OF EXEMPLARY EMBODIMENTS

With reference to the accompanying drawings, the configuration and operation of an electro-optical device according to an exemplary embodiment of the invention is explained below. In addition, the configuration and operation of an electronic apparatus that is provided with such an electro-optical device is also explained below. In the following explanation, a liquid crystal device that operates in a TFT active matrix drive scheme with a built-in driving circuit is taken as an example of an electro-optical device according to an exemplary embodiment of the invention.

First Embodiment

Figure 1:
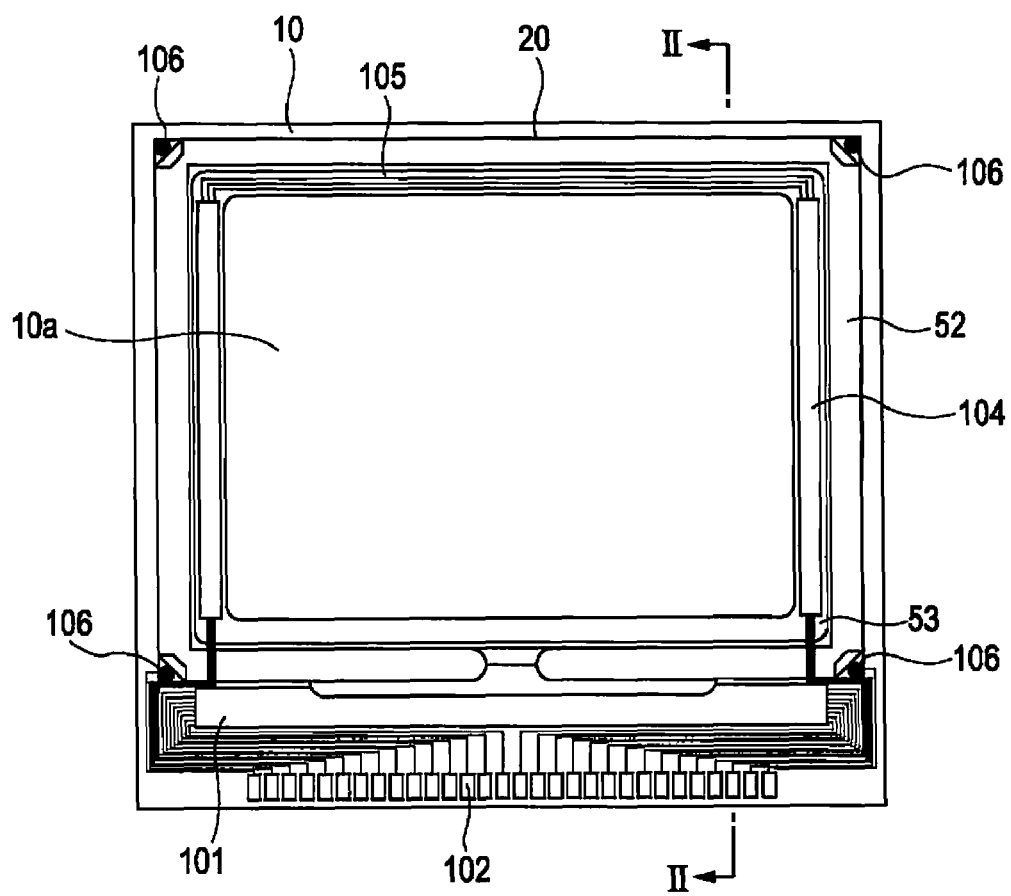
FIG. 1 is a plan view that schematically illustrates an example of the configuration of a liquid crystal device according to a first exemplary embodiment of the invention.
Figure 2:
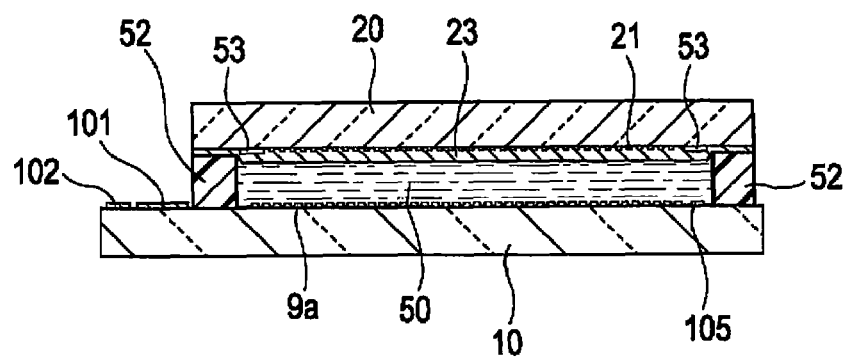
FIG. 2 is a sectional view taken along the line II-II of FIG. 1.

First of all, an example of the general configuration of a liquid crystal device according to the present embodiment of the invention is explained below while referring to FIGS. 1 and 2. FIG. 1 is a plan view that schematically illustrates an example of the configuration of a TFT array substrate and various components formed or deposited thereon, which are viewed from a certain point at the counter-substrate side, or from above the counter substrate. FIG. 2 is a sectional view taken along the line II-II of FIG. 1.

As shown in FIGS. 1 and 2, in the configuration of a liquid crystal device according to the present embodiment of the invention, a TFT array substrate 10 and a counter substrate 20 are provided opposite to each other. The TFT array substrate 10 is a transparent substrate that is made of, for example, a quartz substrate, a glass substrate, a silicon substrate, or the like. It is preferable that not only the TFT array substrate 10 but also the counter substrate 20 should be made of a transparent substrate. A liquid crystal layer 50 is sealed between the TFT array substrate 10 and the counter substrate 20. The TFT array substrate 10 and the counter substrate 20 are bonded to each other with the use of a sealant material 52 that is provided at a sealing region around an image display region 10a. The image display region 10a is a non-limiting example of a "display area" according to an aspect of the invention.

The sealant material 52 is made from, for example, an ultraviolet (UV) curable resin, a thermosetting resin, or the like, which functions to paste these substrates together. In the production process of the liquid crystal device according to the present embodiment of the invention, the sealant material 52 is applied onto the TFT array substrate 10 and subsequently hardened through an ultraviolet irradiation treatment, a heat treatment, or any other appropriate treatment. A gap material such as glass fibers, glass beads, or the like, are scattered in the sealant material 52 so as to set the distance (i.e., inter-substrate gap) between the TFT array substrate 10 and the counter substrate 20 at a predetermined gap value. A liquid crystal device according to the present embodiment of the invention is suitable for providing an enlarged display with a compact body, and especially preferable to be used as a light valve for a projector among many uses thereof.

Inside the sealing area at which the sealant material 52 is provided, and in parallel therewith, a picture frame light-shielding film 53, which has a light-shielding property and defines the picture frame region of the image display area 10a, is provided on the counter substrate 20. Notwithstanding the above, however, a part or a whole of the picture frame light-shielding film 53 may be provided at the TFT-array-substrate (10) side as a built-in light-shielding film.

A data line driving circuit 101 and external circuit connection terminals 102 are provided at a certain peripheral region outside the sealing region at which the sealant material 52 is provided in such a manner that these data line driving circuit 101 and external circuit connection terminals 102 are provided along one of four sides of the TFT array substrate 10. A pair of scanning line driving circuits 104 is provided along two of four sides thereof that are not in parallel with the above-mentioned one side in such a manner that each of the scanning line driving circuits 104 is enclosed by the picture frame light-shielding film 53. In addition to the above, a plurality of electric wirings 105 is provided along the remaining one side of the TFT array substrate 10 that is parallel with the first-mentioned one side thereof. The plurality of electric wirings 105 connects one of the pair of the scanning line driving circuits 104 to the other thereof. The picture frame light-shielding film 53 encloses these electric wirings 105. The pair of the scanning line driving circuits 104 is provided outside the image display region 10a in such a manner that each of these scanning line driving circuits 104 extends along the corresponding one of the second-mentioned two sides thereof.

Inter-substrate conductive material 106, which functions as conductive terminals that connect the upper substrate with the lower substrate, are provided at four corners of the counter substrate 20. On the other hand, another set of inter-substrate conductive terminals is provided on the TFT array substrate 10 at positions each of which is opposite to the corresponding one of the four conductive terminals 106 of the counter substrate 20. With such a structure, it is possible to establish electric conduction between the TFT array substrate 10 and the counter substrate 20.

As illustrated in FIG. 2, a layered structure (i.e., lamination structure) that includes laminations of TFTs for pixel switching, which are driving/driver elements, and of wirings/lines such as scanning lines, data lines, and the like is formed on the TFT array substrate 10. In the image display region 10a, pixel electrodes 9a are arranged in a matrix pattern at a layer above the lamination structure of the pixel-switching TFTs, the scanning lines, the data lines, and the like. An alignment (i.e., orientation) film is deposited on the pixel electrodes 9a. It should be noted that the alignment film is not illustrated in FIG. 2. On the other hand, a light-shielding film 23 is deposited on the surface of the counter substrate 20 opposite the TFT array substrate 10. The light-shielding film 23 is made of, for example, a metal film having light-shielding property. The light-shielding film 23 is formed in a grid pattern, though not limited thereto, in the image display region 10a on the counter substrate 20. The counter electrode 21, which is made of a transparent material such as indium tin oxide (ITO) or the like, is deposited on the light-shielding film 23 in a "solid" manner, that is, as a solid electrode that covers the whole area. Accordingly, the solid counter electrode 21 is formed opposite to the plurality of pixel electrodes 9a. In the exemplary configuration of the liquid crystal device illustrated in FIG. 2, the counter electrode 21 is formed under the light-shielding film 23. Another alignment film is deposited on the counter electrode 21. In the exemplary configuration of the liquid crystal device illustrated in FIG. 2, the alignment film is formed under the counter electrode 21. This alignment film is also not illustrated in FIG. 2. The liquid crystal layer 50 is made of liquid crystal that consists of, for example, a single type of nematic liquid crystal or a mixture of more than one type of nematic liquid crystal. Such liquid crystal takes a predetermined orientation state between a pair of the above-mentioned orientation (i.e., alignment) films.

It should be noted that other functional circuits may also be provided on the TFT array substrate 10 illustrated in FIGS. 1 and 2 in addition to driving circuits such as the above-described data line driving circuit 101, the scanning line driving circuit 104, and the like, including but not limited to, a sampling circuit that performs the sampling of an image signal that flows on an image signal line so as to supply the sampled signal to a data line, a pre-charge circuit that supplies a pre-charge signal having a predetermined voltage level to each of the plurality of data lines prior to the supplying of an image signal, a test circuit for conducting an inspection on the quality, defects, etc., of the electro-optical device during the production process or before shipment, and the like.

Figure 3:
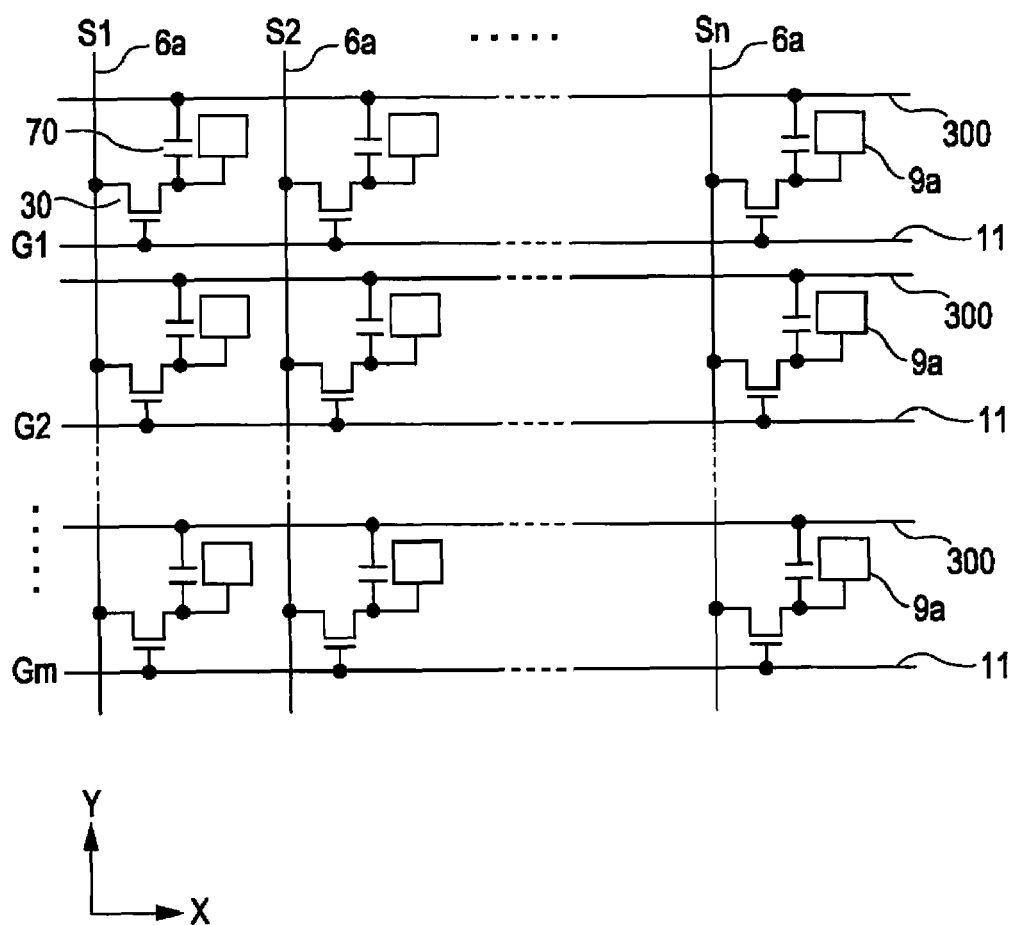
FIG. 3 is an equivalent circuit diagram that schematically illustrates an example of constituent elements and wirings in a plurality of pixels that are arranged in a matrix pattern so as to constitute the image display region of a liquid crystal device according to the first exemplary embodiment of the invention.

Next, the electric configuration of the pixel unit (i.e., pixel portion) of a liquid crystal device according to the present embodiment of the invention is explained below with reference to FIG. 3. FIG. 3 is an equivalent circuit diagram that schematically illustrates an example of constituent elements and wirings in a plurality of pixels that are arranged in a matrix pattern so as to constitute the image display region of a liquid crystal device according to the present embodiment of the invention.

As illustrated in FIG. 3, a TFT 30, which is an example of a "transistor" according to an aspect of the invention, as well as the pixel electrode 9a is provided in each of the plurality of pixels that are arranged in a matrix pattern so as to constitute the image display region 10a. The TFT 30 is electrically connected to the pixel electrode 9a so as to perform switching control on the pixel electrode 9a at the time of operation of the liquid crystal device. Each of data lines 6a to which image signals are supplied is electrically connected to the source of the TFT 30. Image signals S1, S2, . . . , and Sn that are written on the data lines 6a may be supplied respectively in this order in a line sequential manner. Alternatively, an image signal may be supplied to each of a plurality of groups thereof. Each group consists of a plurality of the data lines 6a arrayed adjacent to one another.

Each of scanning lines 11 is connected to the gate of the TFT 30. The liquid crystal device according to the present embodiment of the invention is configured to apply, at a predetermined timing and in a pulse pattern, scanning signals G1, G2, . . . , and Gm to the scanning lines 11 in this order in a line sequential manner. Each of the pixel electrodes 9a is electrically connected to the drain of the TFT 30. When the switch of the TFT 30, which functions as a switching element, is closed for a certain time period, the image signal S1, S2, . . . , or Sn that is supplied through the data line 6a is written at a predetermined timing. After being written into liquid crystal, which is an example of electro-optical material, via the pixel electrodes 9a, the image signals S1, S2, . . . , and Sn having a predetermined level are held for a certain time period between the pixel electrode 9a and the counter electrode formed on the counter substrate.

Since liquid crystal that constitutes the liquid crystal layer 50 (refer to FIG. 2) changes its orientation and/or order of molecular association depending on the level of a voltage being applied, it modulates light to realize gradation display.

Under a "normally-white" mode, the optical transmittance, that is, light transmission factor, with respect to an incident light beam decreases in accordance with a voltage applied on a pixel-by-pixel basis (i.e., to each pixel), whereas, under a "normally-black" mode, the optical transmittance with respect to an incident light beam increases in accordance with a voltage applied on a pixel-by-pixel basis. Thus, when viewed as a whole, light having a certain contrast in accordance with an image signal is emitted from the liquid crystal device.

In order to prevent the leakage of the image signals being held, a storage capacitor 70 is added in parallel with a liquid crystal capacitor that is formed between the pixel electrode 9a and the counter electrode 21 (refer to FIG. 2). The storage capacitor 70 is a capacitive element that functions as a hold capacitor or a retention volume for temporally holding the electric potential of each of the pixel electrodes 9a in accordance with the supply of an image signal. One electrode of the storage capacitor 70 is connected to the drain of the TFT 30 in parallel connection with the pixel electrode 9a, whereas the other electrode thereof is connected to a capacitor line 300 with a fixed electric potential so as to provide a constant electric potential (i.e., potentiostatic). The storage capacitor 70 improves the electric potential retention property at the pixel electrode 9a. Therefore, it is possible to improve display characteristics, which could be perceived as enhanced contrast and/or reduced flickers. As will be described later, the storage capacitor 70 functions also as a built-in light-shielding film that shuts off light entering toward the TFT 30.

Figure 4:
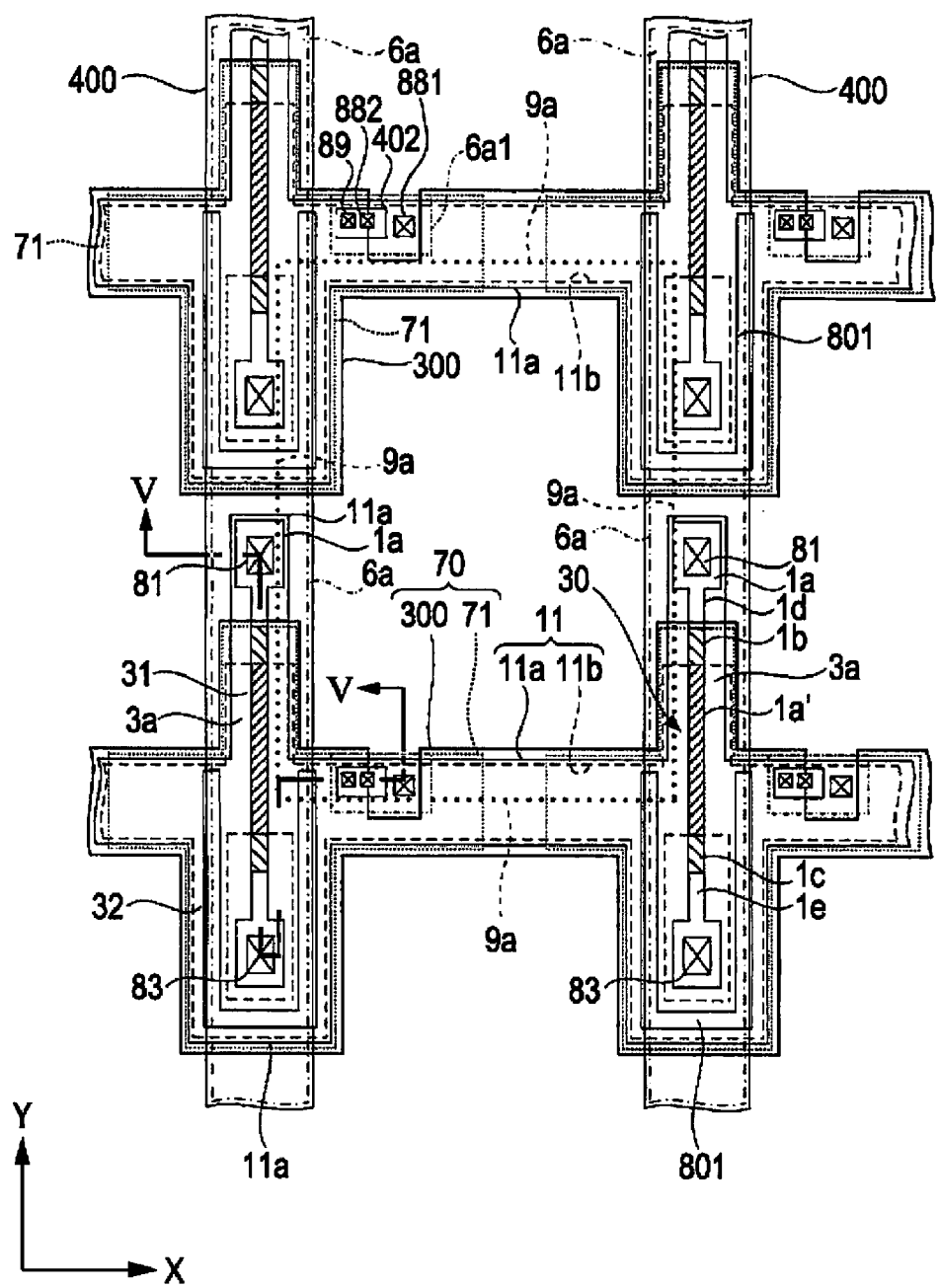
FIG. 4 is a plan view that schematically illustrates an example of the configuration of a plurality of pixel units that are arrayed adjacent to one another.
Figure 5:
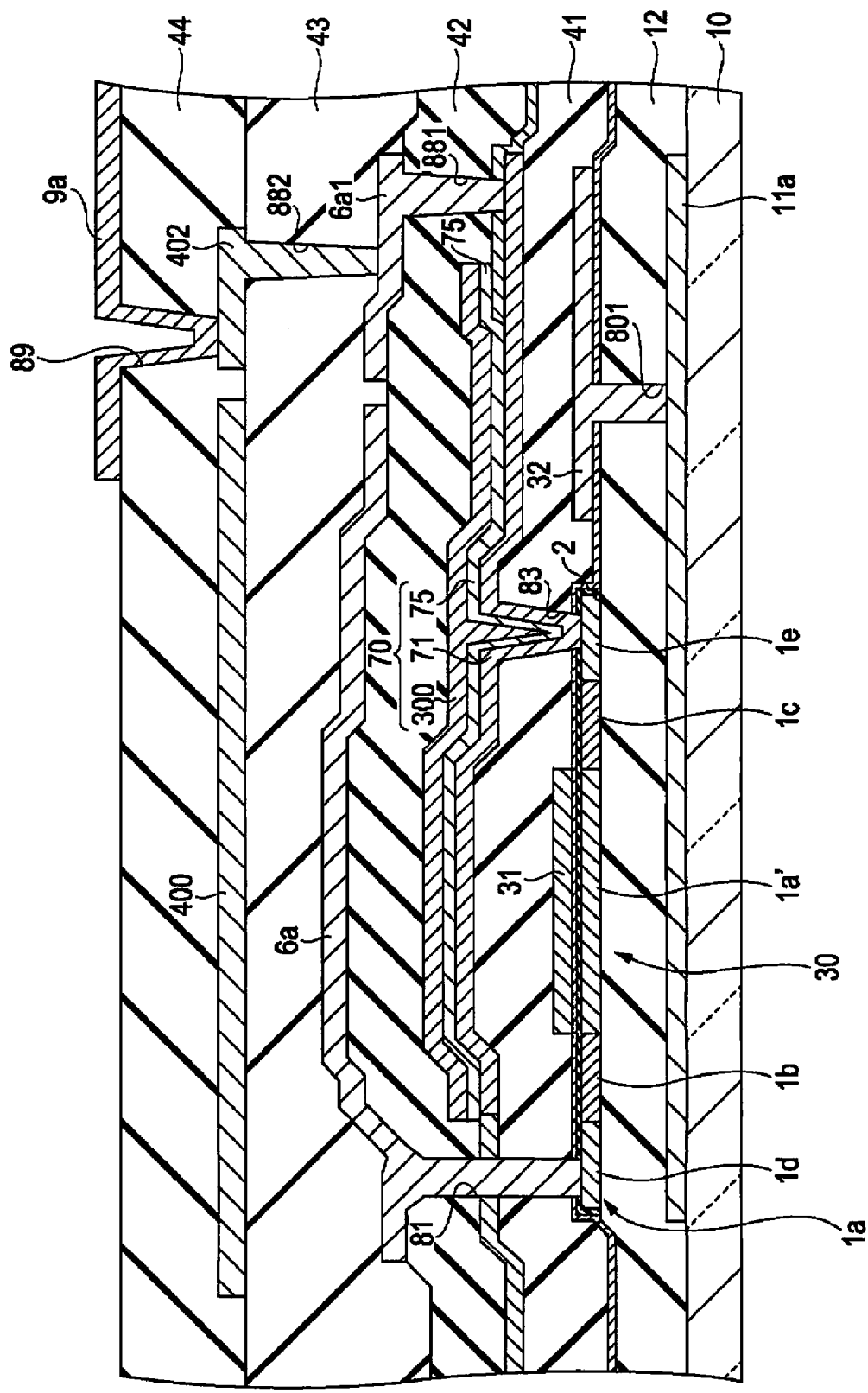
FIG. 5 is a sectional view taken along the line V-V of FIG. 4.

Next, with reference to FIGS. 4 and 5, the specific configuration of a pixel unit that realizes operation described above is explained below. FIG. 4 is a plan view that schematically illustrates an example of the configuration of the plurality of pixel units that are arrayed adjacent to one another. FIG. 5 is a sectional view taken along the line V-V of FIG. 4. In referring to FIGS. 4 and 5, it should be noted that different scales are used for layers/members illustrated in these drawings so that each of the layers/members has an illustrated size that is easily recognizable in each of these drawings. The same holds true for each of other accompanying drawings that will be referred to later. For convenience of explanation, in FIGS. 4 and 5, layer portions deposited above the pixel electrodes 9a are omitted from these drawings.

As illustrated in FIG. 4, the plurality of pixel electrodes 9a is arranged in a matrix pattern over the TFT array substrate 10. FIG. 4 schematically illustrates an enlarged or close-up view of an arbitrary single pixel unit and its constituent/peripheral elements including the corresponding pixel electrode 9a among a plurality of pixel units that are arrayed in the image display region 10a. The data line 6a extends along a longitudinal boundary line between each two pixel electrodes 9a arrayed adjacent to each other. On the other hand, the scanning line 11 extends along a latitudinal boundary line between each two pixel electrodes 9a arrayed adjacent to each other. That is, each of the scanning lines 11 extends in the X direction, whereas each of the data lines 6a extends in the Y direction so as to intersect with the scanning lines 11. Each scanning line 11 is made up of two line components, that is, a first scanning line 11a and a second scanning line 11b. The first scanning line 11a doubles as, that is, functions also as, a lower light shielding film. The second scanning line 11b and a gate electrode 3a are formed as a single pattern. The first scanning line 11a and the second scanning line 11b extend in the X direction as duplex lines. At each intersection where the data lines 6a and the scanning lines 11 traverse, that is, intersect each other, the pixel-switching TFT 30 is provided. Since the first scanning line 11a and the second scanning line 11b are wired as duplex lines that substantially overlap each other as viewed along the X direction in two dimensions, it is possible to make the overall electric resistance of the scanning line 11 lower than otherwise. Even in a case where a certain line failure such as disconnection occurs in either one of the first scanning line 11a and the second scanning line 11b, the other of these two lines functions in a redundant manner, thereby offering line-fault tolerance. Therefore, such a duplex line configuration makes it possible to increase the operation reliability of a liquid crystal device.

When viewed in two dimensions, that is, in a plan view, the scanning line 11, the data line 6a, the storage capacitor 70, the TFT 30, an upper light-shielding layer 400, and a relay layer 6a1, though not limited thereto, are arranged inside a non-open region that surrounds the open region of each pixel corresponding to a pixel electrode 9a (where the term "open region" means an aperture area in each pixel which transmits or reflects light that actually contributes to display, whereas the term "non-open region" means a non-aperture area which blocks and shuts off light) over the TFT array substrate 10. In other words, the scanning line 11, the data line 6a, the storage capacitor 70, the TFT 30, the upper light-shielding layer 400, and the relay layer 6a1, though not limited thereto, are arranged not in the open region of each pixel but in the non-open region thereof so as not to obstruct display.

In the following description, a detailed explanation is given of component layers that make up the lamination structure of the pixel units formed over the TFT array substrate 10. First of all, the layer structure of the undermost first layer is explained below.

The first scanning line 11a is formed in the first layer of the lamination structure of the pixel unit. The first scanning line 11a is made of conductive polysilicon, though not necessarily limited thereto. The first scanning line 11a has a film thickness of, for example, 200 nm. As illustrated in FIG. 4, the first scanning line 11a has a main line portion that extends in the X direction. In addition, the first scanning line 11a has a non-main-line extending portion that extends in the Y direction from the X-directional main line portion. As illustrated therein, the Y-directional non-main-line extending portion of the first scanning line 11a overlaps the channel region 1a' of the semiconductor layer 1a of the TFT 30 in a plan view.

It is preferable that the first scanning line 11a should be formed in such a manner that it includes, as illustrated in FIG. 4, a region (i.e., area) opposite to the channel region 1a', the data-line-side LDD region 1b, the pixel-electrode-side LDD region 1c, the data-line-side source/drain region 1d, and the pixel-electrode-side source/drain region 1e of the TFT 30. Thus, thanks to the presence of the first scanning line 11a, it is possible to almost or completely shut off a return light bem, including but not limited to, light attributable to backside reflection at the TFT array substrate 10, light that is emitted from other liquid crystal device such as a multiple-plate type projector, etc., to penetrate through a composite optical system, and so on, thereby effectively protecting the channel region 1a' of the TFT 30. That is, the first scanning line 11a functions not only as wiring for supplying a scanning signal but also as a lower light-shielding film of the TFT 30, which is provided to shut off return light.

As illustrated in FIG. 5, the first scanning line 11a is formed in the first layer, whereas the TFT 30 is formed in the second layer. As shown therein, an underlying insulation film 12, or, in other words, ground insulator film 12, is interposed between the first-layer first scanning line 11a and the second-layer TFT 30. The underlying insulation film 12 has a function of insulating the TFT 30 from the first scanning line 11a. In addition thereto, the underlying insulation film 12 that is formed over the entire surface of the TFT array substrate 10 has a function of preventing any degradation in the characteristics and/or performance of the pixel-switching TFT 30 that is attributable to the surface roughness of the TFT array substrate 10 caused at the time of surface polishing thereof or attributable to any stains that remain without being completely removed after washing thereof, though not limited thereto. The underlying insulation film 12 has a bi-layer (i.e., double-layer) structure. As a non-limiting example of the lamination structure thereof, the underlying insulation film 12 has one layer that is made of tetra-ethyl ortho-silicate (hereafter abbreviated as TEOS) and the other layer that is made of high temperature oxide (hereafter abbreviated as HTO). For example, the TEOS film has a thickness of 300 nm, whereas the HTO film has a thickness of 50 nm, though not limited thereto.

The TFT 30 that is formed on the second layer has a semiconductor film 1a and a gate electrode 3a. In the following description, the semiconductor film 1a may be referred to as semiconductor layer 1a.

The semiconductor layer 1a is made of, for example, polysilicon. The semiconductor layer 1a has a film thickness of, for example, 55 nm. As illustrated in FIGS. 4 and 5, the semiconductor layer 1a consists of the channel region 1a', the data-line-side LDD region 1b, the pixel-electrode-side LDD region 1c, the data-line-side source/drain region 1d, and the pixel-electrode-side source/drain region 1e. The channel region 1a' has a channel length along the Y direction. That is, the TFT 30 has an LDD structure. It should be noted that the data-line-side LDD region 1b is an example of "a first junction region" according to an aspect of the invention, whereas the pixel-electrode-side LDD region 1c is an example of "a second junction region" according to an aspect of the invention.

The data-line-side source/drain region 1d and the pixel-electrode-side source/drain region 1e are formed approximately in mirror symmetry along the Y direction with respect to the channel region 1a'. The data-line-side LDD region 1b is formed between the channel region 1a' and the data-line-side source/drain region 1d. The pixel-electrode-side LDD region 1c is formed between the channel region 1a' and the pixel-electrode-side source/drain region 1e. The data-line-side LDD region 1b, the pixel-electrode-side LDD region 1c, the data-line-side source/drain region 1d, and the pixel-electrode-side source/drain region 1e are impurity regions that are formed by implanting impurities into the semiconductor film 1a by using, for example, an ion implantation method, or other alternative method. The data-line-side LDD region 1b and the pixel-electrode-side LDD region 1c are deposited as lightly doped (low concentration) impurity regions having less impurities than the data-line-side source/drain region 1d and the pixel-electrode-side source/drain region 1e, respectively. According to such an impurity region, it is possible to reduce the amount of an OFF-state current that flows in the data-line-side source/drain region 1d and the pixel-electrode-side source/drain region 1e during the non-operating time of the TFT 30, and also to suppress the decrease of an ON-state current that flows during the operating time of the TFT 30. It should be noted that, although it is preferable that the TFT 30 has an LDD structure, it might be configured to have an offset structure in which the implantation of impurities is not performed on the data-line-side LDD region 1b and the pixel-electrode-side LDD region 1c. As another alternative example, it may be configured that impurities are heavily doped while using the gate electrode as a mask (i.e., high concentration) so as to deposit the data-line-side source/drain region and the pixel-electrode-side source/drain region, which may be referred to as a self-aligned structure.

As illustrated in FIGS. 4 and 5, the second scanning line 11b and the gate electrode 3a are formed as a single pattern (as has already been described above). The second scanning line 11b is formed as a result of the lamination of a film made of conductive polysilicon and a film made of tungsten silicide (WSi). Each of the conductive polysilicon film and the tungsten silicide film has a thickness of, for example, 60 nm. As illustrated in FIG. 4, the second scanning line 11b has a main line portion that extends in the X direction. The X-directional main line portion of the second scanning line 11b extends in parallel with the X-directional main line portion of the first scanning line 11a; or, more exactly, the X-directional main line portion of the second scanning line 11b extends in such a manner that it overlaps the X-directional main line portion of the first scanning line 11a when viewed in plan. In addition, the second scanning line 11b has a non-main-line extending portion that extends in the Y direction from the X-directional main line portion. As illustrated therein, the Y-directional non-main-line extending portion of the second scanning line 11b overlaps the channel region 1a' of the semiconductor layer 1a of the TFT 30 in a plan view. The channel overlapping part of the Y-directional non-main-line extending portion of the second scanning line 11b, which overlaps the channel region 1a' of the semiconductor layer 1a of the TFT 30 in a plan view, functions as the gate electrode 3a.

A gate insulation film 2 is deposited between the gate electrode 3a that is formed as a part of the second scanning line 11b and the semiconductor layer 1a so as to provide insulation between the gate electrode 3a and the semiconductor layer 1a. In the configuration of a liquid crystal device according to the present embodiment of the invention, as illustrated in the sectional view of FIG. 5, a contact hole 801 is formed through the underlying insulation film 12. As illustrated in the plan view of FIG. 4, the contact hole 801 is elongated along each side of the semiconductor layer 1a. The gate electrode 3a has a gate-electrode main portion 31 and a gate-electrode extending portion 32. The gate-electrode main portion 31 of the gate electrode 3a functions as a gate electrode as its name indicates. The gate-electrode extending portion 32 of the gate electrode 3a extends from the gate-electrode main portion 31 thereof. A part of the gate-electrode extending portion 32 of the gate electrode 3a is formed inside the contact hole 801. The inner-hole part of the gate-electrode extending portion 32 explained above is electrically connected to the first scanning line 11a through the contact hole 801.

As illustrated in FIG. 5, a first inter-bedded insulation film (i.e., first interlayer insulation film) 41 is formed at a layer over the TFT 30. The first inter-bedded insulation film 41 provides insulation between the second layer and the third layer. The first inter-bedded insulation film 41 is made of a TEOS film that has a thickness of 300 nm, though not limited thereto. A contact hole 83 is formed through the first inter-bedded insulation film 41. The pixel-electrode-side source/drain region 1e of the semiconductor layer 1a of the TFT 30 is electrically connected to the lower capacitor electrode 71 of the storage capacitor 70 via the contact hole 83. On the other hand, a contact hole 81 is formed through the first inter-bedded insulation film 41. The data-line-side source/drain region 1d of the semiconductor layer 1a of the TFT 30 is electrically connected to the data line 6a via the contact hole 81.

The aforementioned storage capacitor 70 is formed in (i.e., at) the third layer so as to overlie the first inter-bedded insulation film 41. The storage capacitor 70 has the lower capacitor electrode 71 and an upper capacitor electrode 300 that are formed opposite to each other. A dielectric film 75 is sandwiched between the lower capacitor electrode 71 and the upper capacitor electrode 300.

The upper capacitor electrode of the storage capacitor 70 and the aforementioned capacitor line are formed as a single pattern; or, in other words, a part of the capacitor line 300 is formed as the upper capacitor electrode of the storage capacitor 70. The capacitor line 300 has a tri-laminated (i.e., three-layer) structure. As a non-limiting specific example thereof, the capacitor line 300 includes one titanium nitride (TiN) film that has a thickness of 50 nm and another titanium nitride film that has a thickness of 100 nm. In addition, the capacitor line 300 further includes an aluminum (Al) film that has a thickness of 150 nm. The aluminum film is sandwiched between the above-mentioned one titanium nitride film and the above-mentioned another titanium nitride film so as to make up the three-layer structure of the capacitor line 300. The capacitor line 300 extends from the image display region 10a, at which the pixel electrodes 9a are provided, to the periphery thereof. The capacitor line 300 is electrically connected to a constant/fixed electric potential source. With such an electric connection, the electric potential of the upper capacitor electrode (i.e., capacitor line 300) is maintained at a predetermined constant/fixed electric potential. A detailed configuration of the capacitor line 300 is not illustrated in the drawing. As illustrated in FIG. 4, the capacitor line 300 has a main line portion that extends in the X direction. In addition, the capacitor line 300 has a non-main-line extending portion that extends in the Y direction from the X-directional main line portion. As illustrated therein, the Y-directional non-main-line extending portion of the capacitor line 300 overlaps the channel region 1a', the data-line-side LDD region 1b, the pixel-electrode-side LDD region 1c, and the pixel-electrode-side source/drain region 1e of the semiconductor layer 1a of the TFT 30 in a plan view. A combination of the Y-directional non-main-line extending portion of the capacitor line 300 and a part of the X-directional main line portion thereof that overlaps the lower capacitor electrode 71 in a plan view functions as the upper capacitor electrode (of the storage capacitor 70) mentioned above. Accordingly, the upper capacitor electrode (300), which is connected to the fixed/constant electric potential source via the capacitor line 300 as explained above, functions as a fixed-electric-potential-side capacitor electrode (i.e., constant-electric-potential-side capacitor electrode) that is maintained at a fixed/constant electric potential.

The lower capacitor electrode 71 is formed to have a film thickness of, for example, 100 nm. The lower capacitor electrode is made of conductive polysilicon. As illustrated in the plan view of FIG. 4, the lower capacitor electrode 71 has an X-directional extending portion and a Y-directional extending portion each of which overlaps the upper capacitor electrode 300 when viewed in plan. A part of the Y-directional extending portion of the lower capacitor electrode 71 overlaps the pixel-electrode-side source/drain region 1e of the semiconductor layer 1a of the TFT 30 in a plan view. In addition, the above-mentioned part of the Y-directional extending portion of the lower capacitor electrode 71 is electrically connected to the pixel-electrode-side source/drain region 1e of the semiconductor layer 1a of the TFT 30 via the contact hole 83. As illustrated in FIG. 4, some part of the X-directional main line portion of the capacitor line 300 has a smaller width than that of other part thereof as though a part of the capacitor line 300 were cut out. Because of such a locally narrow structure of the X-directional main line portion thereof, the capacitor line 300 does not cover a contact hole 881. In addition, a part of the X-directional extending portion of the lower capacitor electrode 71 is exposed at the "cutout" area of the capacitor line 300. The above-mentioned part of the X-directional extending portion of the lower capacitor electrode 71 that is exposed at the cutout area of the capacitor line 300 is electrically connected to the aforementioned relay layer 6a1, which is formed in the fourth layer, through the contact hole 881. The relay layer 6a1 that is formed in the fourth layer is electrically connected to another relay layer 402, which is formed in the fifth layer, via another contact hole 882. The relay layer 402 is electrically connected to the pixel electrode 9a via still another contact hole 89. Therefore, the lower capacitor electrode 71 functions as a pixel-electric-potential-side capacitor electrode whose electric potential is kept at a pixel electric potential.

The dielectric film 75 has a bi-layer structure. As a non-limiting example of the lamination structure thereof, the dielectric film 75 has one layer that is made of HTO and the other layer that is made of silicon nitride (hereafter abbreviated as SiN). The HTO film has a thickness of 4 nm. The SiN film has a thickness of 15 nm.

As illustrated in FIG. 5, a second inter-bedded insulation film 42 is formed at a layer over the storage capacitor 70. The second inter-bedded insulation film 42 provides insulation between the third layer and the fourth layer. The second inter-bedded insulation film 42 is made of a TEOS film that has a thickness of 400 nm, though not limited thereto. The contact hole 881 penetrates through the second inter-bedded insulation film 42 to reach the surface of the lower capacitor electrode 71. Accordingly, the open bottom of the contact hole 881 partially exposes the surface of the lower capacitor electrode 71. The contact hole 81 penetrates through both the second inter-bedded insulation film 42 and the first inter-bedded insulation film 41 and further through the gate insulation film 2 to reach the surface of the semiconductor layer 1a. Accordingly, the open bottom of the contact hole 81 partially exposes the surface of the semiconductor layer 1a.

As illustrated in FIGS. 4 and 5, the data line 6a and the relay layer 6a1 are formed on the fourth layer.

As illustrated in FIG. 5, the data line 6a is electrically connected to the data-line-side source/drain region 1d of the semiconductor layer 1a via the contact hole 81. On the other hand, the relay layer 6a1 is electrically connected to the lower capacitor electrode 71 via the contact hole 881. The data line 6a and the relay layer 6a1 are formed by, firstly, depositing a thin film that is made of a conductive material such as a metal film on the second inter-bedded insulation film 42 by means of a thin film deposition technique, and then by partially removing the thin film (i.e., patterning) so as to separate the data line 6a from the relay layer 6a1. Therefore, the manufacturing process of a liquid crystal device according to the present embodiment of the invention is simplified because the data line 6a and the relay layer 6a1 can be formed in the same single production step. Each of the data line 6a and the relay layer 6a1 has a quad-laminated (i.e., four-level) structure. As a non-limiting specific example of such a quad-laminated structure thereof, a titanium (Ti) film that has a thickness of 20 nm, a titanium nitride (TiN) film that has a thickness of 50 nm, an aluminum (Al) film that has a thickness of 350 nm, and another TiN film that has a thickness of 150 nm are laminated one after another in the order of appearance herein.

As illustrated in FIG. 5, a third inter-bedded insulation film 43 is formed at a layer over the data line 6a and the relay layer 6a1. The third inter-bedded insulation film 43 provides insulation between the fourth layer and the fifth layer. The third inter-bedded insulation film 43 is formed as, for example, a TEOS layer that has a film thickness of 600 nm. The contact hole 882 penetrates through the third inter-bedded insulation film 43 to reach the surface of the relay layer 6a1. Accordingly, the open bottom of the contact hole 882 partially exposes the surface of the relay layer 6a1. It is preferable that the surface of the third inter-bedded insulation film 43 should be subjected to planarization processing by means of a chemical mechanical polishing (CMP) method or other alternative surface-smoothing treatment.

The upper light-shielding layer 400 and the relay layer 402 are formed in the fifth layer. As illustrated in FIG. 4, the upper light-shielding layer 400 is formed in such a manner that it extends along a direction in which the data line 6a extends, that is, along the Y direction. Each of the data line 6a and the upper light-shielding layer 400 is wired at a region opposite to the channel region 1a', the data-line-side LDD region 1b, the pixel-electrode-side LDD region 1c, the data-line-side source/drain region 1d, and the pixel-electrode-side source/drain region 1e of the semiconductor layer 1a. Such a wiring pattern of the data line 6a and the upper light-shielding layer 400 makes it possible to shut off any incident light beam entering from the upper-layer side toward any of these regions.

In FIG. 5, it is preferable that the relay layer 402 should be made of the same film as that of the upper light-shielding layer 400. As has already been explained above, the relay layer 402 is electrically connected to the pixel electrode 9a. In addition, the relay layer 402, which is the upper relay layer, is electrically connected to the relay layer 6a1, which is the lower relay layer. Accordingly, the relay layer 402 electrically connects the pixel electrode 9a and the relay layer 6a1 to each other. Or, in other words, the upper relay layer 402 provides electric relay connection between the pixel electrode 9a and the lower relay layer 6a1. Each of the upper light-shielding layer 400 and the relay layer 402 has a bi-layer (i.e., double-layer) structure. As a non-limiting example of the lamination structure thereof, the upper light-shielding layer 400 has one film that is made of aluminum (Al) and has a thickness of 350 nm and the other film that is made of titanium nitride (TiN) and has a thickness of 150 nm. The relay layer 402 has the same lamination structure as that of the upper light-shielding layer 400 explained above.

As illustrated in FIG. 5, a fourth inter-bedded insulation film 44 is formed at a layer over the upper light-shielding layer 400 and the relay layer 402. The fourth inter-bedded insulation film 44 provides insulation between the fifth layer and the sixth layer. The fourth inter-bedded insulation film 44 has a double-layer structure that is made up of, for example, a TEOS layer that has a film thickness of 600 nm and a boron silicate glass (BSG) layer that has a film thickness of 75 nm. The contact hole 89 penetrates through the fourth inter-bedded insulation film 44 to reach the surface of the relay layer 402. Accordingly, the open bottom of the contact hole 89 partially exposes the surface of the relay layer 402. It is preferable that the surface of the fourth inter-bedded insulation film 44 should be subjected to planarization processing by means of a chemical mechanical polishing (CMP) method or other alternative surface-smoothing treatment.

As illustrated in FIGS. 4 and 5, the pixel electrode 9a is formed in the sixth layer. As illustrated in the sectional view of FIG. 5, the pixel electrode 9a is electrically connected to the relay layer 402 through the contact hole 89 and further relay-connected from the upper relay layer 402 to the lower relay layer 6a1 through the contact hole 882. The lower relay layer 6a1 is electrically connected to the lower capacitor electrode 71 via the contact hole 881. The lower capacitor electrode 71 is electrically connected to the pixel-electrode-side source/drain region 1e of the semiconductor layer 1a through the contact hole 83. Therefore, the pixel electrode 9a is indirectly connected to the pixel-electrode-side source/drain region 1e of the semiconductor layer 1a through the electrical relay structure provided therebetween. As has already been explained above while making reference to FIG. 2, an alignment film that is subjected to a predetermined orientation processing such as rubbing processing or the like is provided on the upper surface of the pixel electrodes 9a.

The structure described above is common to each of the pixel units as illustrated in FIG. 4. In the image display region 10a that is illustrated in FIG. 1, the pixel units are provided in a regular pattern (e.g., periodic array).

Figure 6:
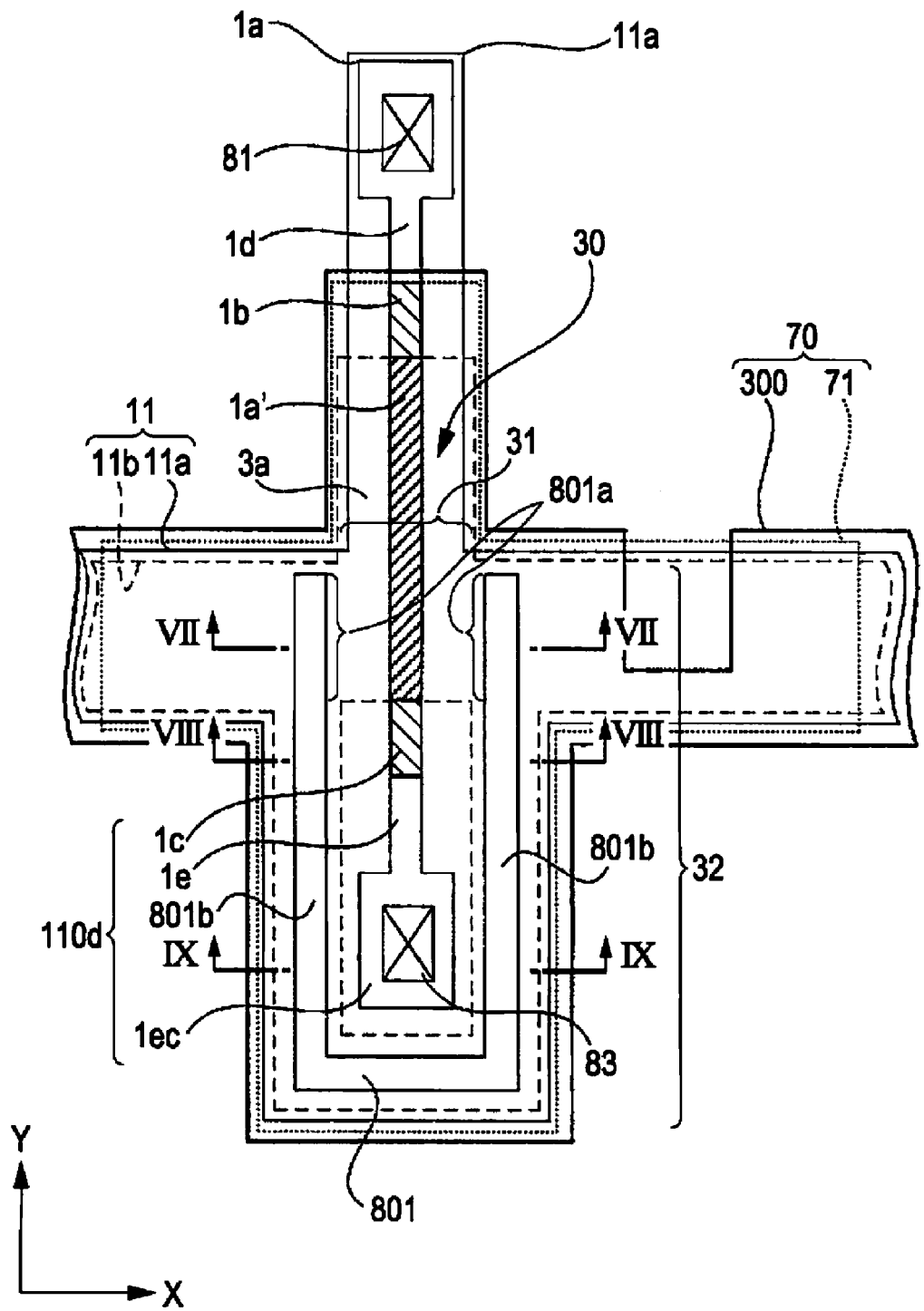
FIG. 6 is a partial plan view that schematically illustrates, in a two-dimensional layout, an example of the partial lamination structure of a pixel unit illustrated in the sectional view of FIG. 5, or more specifically, the first layer, the second layer, and the third layer thereof.
Figure 7:
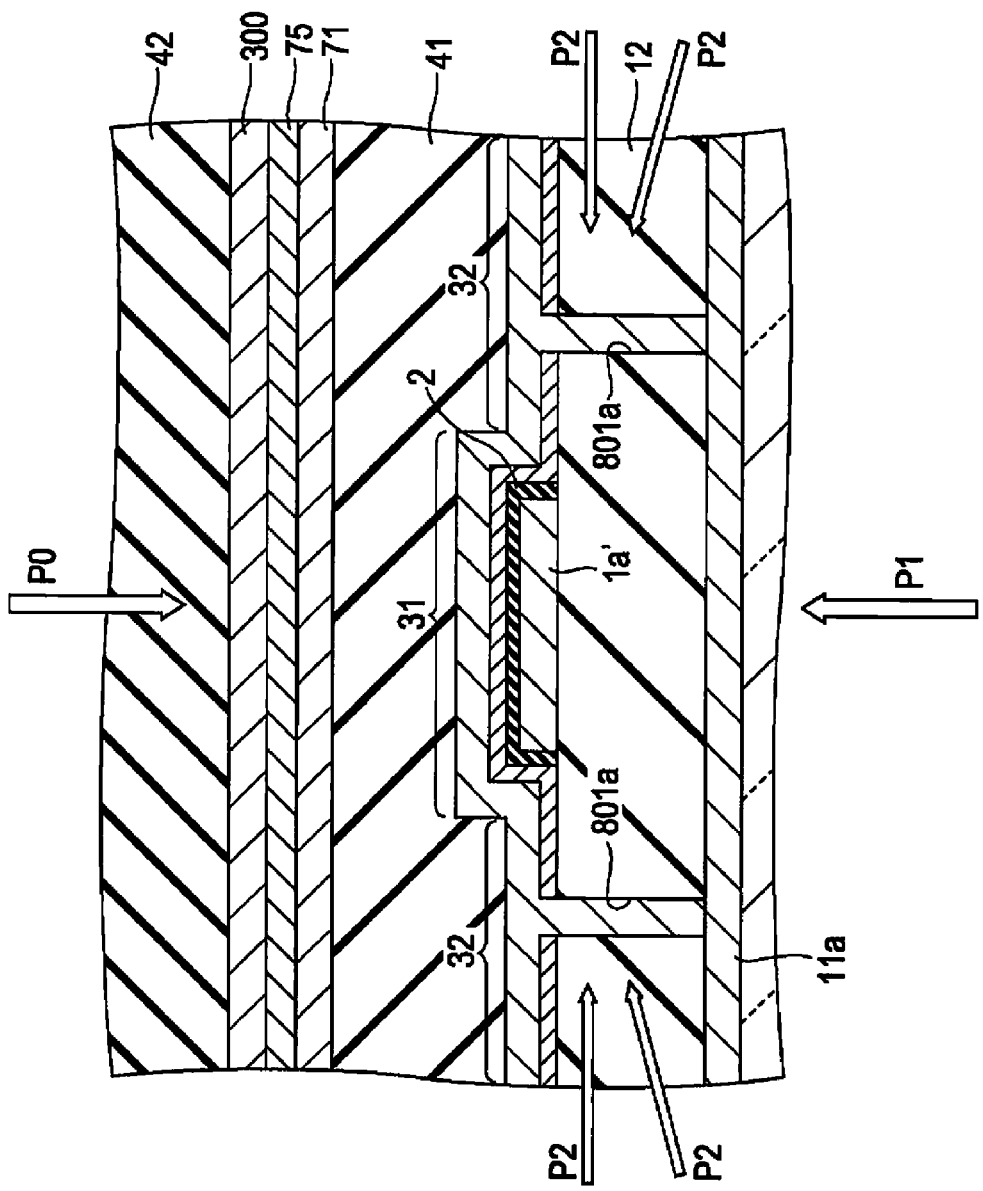
FIG. 7 is a sectional view taken along the line VII-VII of FIG. 6.
Figure 8:
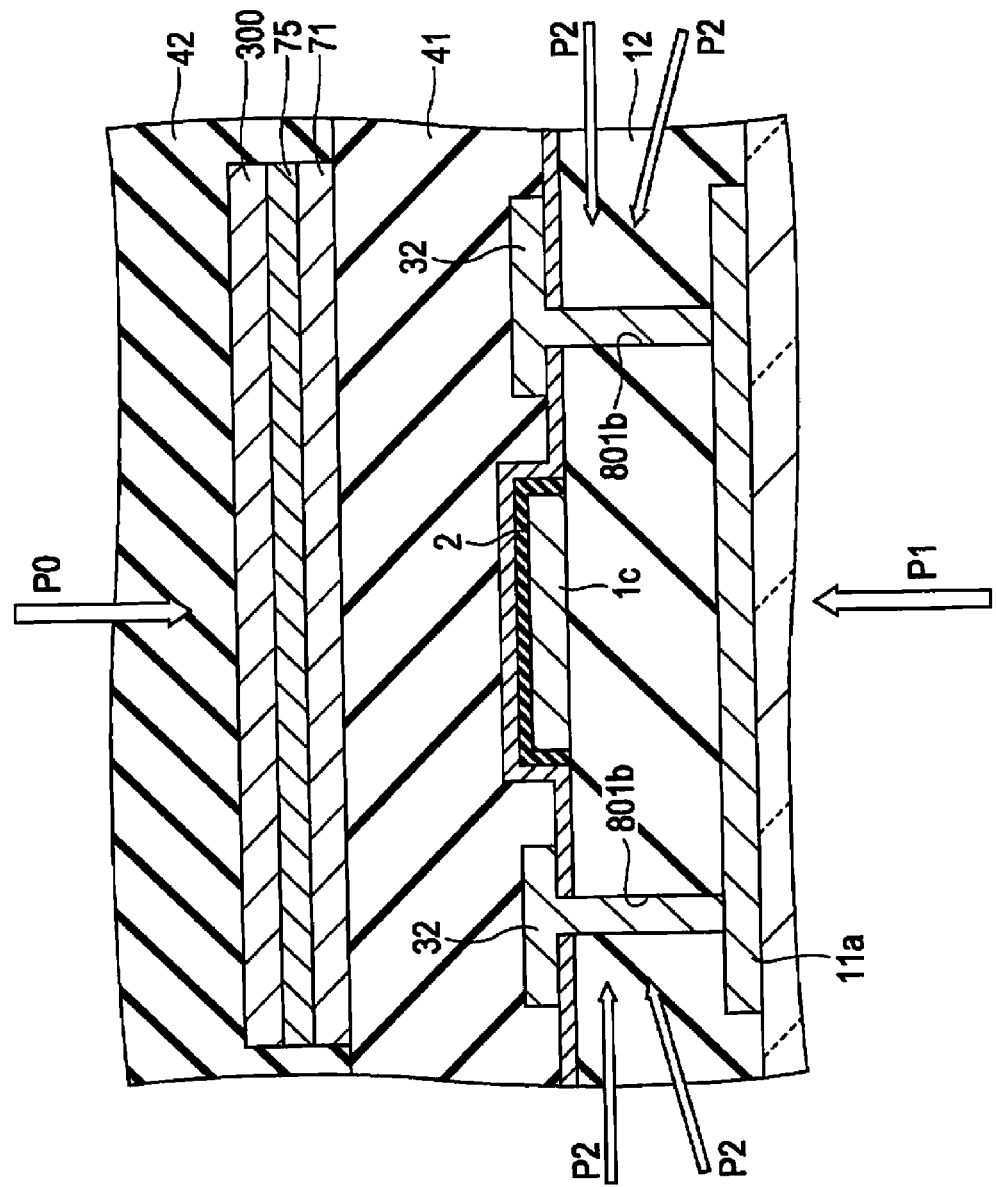
FIG. 8 is a sectional view taken along the line VIII-VIII of FIG. 6.
Figure 9:
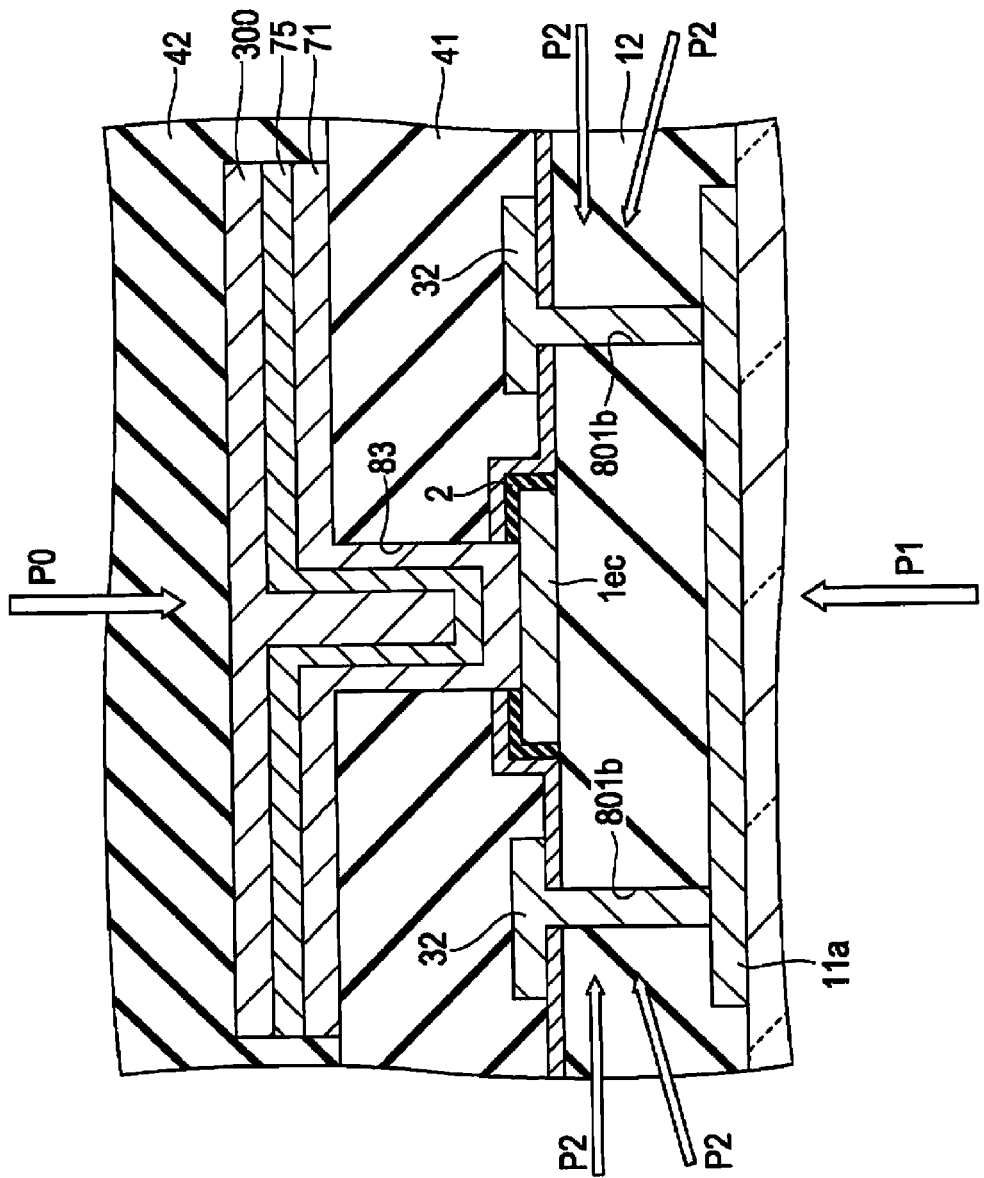
FIG. 9 is a sectional view taken along the line IX-IX of FIG. 6.

In the following description, a unique light-shielding structure according to the present embodiment of the invention, which shuts off light that enters and/or propagates toward the semiconductor layer 1a of the TFT 30, is explained in detail while referring to FIGS. 6, 7, 8, and 9. FIG. 6 is a partial plan view that schematically illustrates, in a two-dimensional layout, an example of the partial lamination structure of a pixel unit illustrated in the sectional view of FIG. 5, or more specifically, the first layer, the second layer, and the third layer thereof. FIG. 7 is a sectional view taken along the line VII-VII of FIG. 6. FIG. 8 is a sectional view taken along the line VIII-VIII of FIG. 6. FIG. 9 is a sectional view taken along the line IX-IX of FIG. 6.

As has already been explained earlier while referring to the sectional view of FIG. 5, the contact hole 801 is formed through the underlying insulation film 12.

As illustrated in the plan view of FIG. 6, the contact hole 801, which is formed at a layer over the TFT array substrate 10, has a "channel-region adjacent portion" 801a that is formed next to the channel region 1a' of the semiconductor layer 1a. As further illustrated therein, the contact hole 801 has a first extending portion 801b that extends from the channel-region adjacent portion 801a. It should be particularly noted that the terms "adjacent" and "next" are used in the description of this specification as well as in the recitation of the appended claim without any explicit or implicit limitation to the narrow meaning of "close" or "proximate"; that is, the contact hole 801 may be provided close to the channel region 1a' of the semiconductor layer 1a but never limited thereto. Or, in other words, the terms "adjacent" and "next" are used in the description of this specification as well as in the recitation of the appended claim without any intention to restrictively define the distance between the contact hole (801) and the channel region (1a') of the semiconductor film (1a). More specifically, as viewed in a two-dimensional layout, the contact hole 801 is formed in such a manner that it extends from one side area adjacent to the channel region 1a' of the semiconductor layer 1a to the other opposite side area adjacent to the channel region 1a' of the semiconductor layer 1a in a "circuitous U-shaped" extension pattern. Accordingly, when viewed in plan over the TFT array substrate 10, the first extending portion 801b of the contact hole 801 is formed around a part of the semiconductor layer 1a so as to partially surround the semiconductor layer 1a. That is, the channel-region adjacent portion 801a of the contact hole 801 is formed next to the channel region 1a' of the semiconductor layer 1a at each side thereof in a plan view. The first extending portion 801b of the contact hole 801 extends from the one-side channel-region adjacent portion 801a thereof, which is formed adjacent to the channel region 1a' of the semiconductor layer 1a at one side thereof, to the other-side channel-region adjacent portion 801a thereof, which is formed adjacent to the channel region 1a' of the semiconductor layer 1a at the other opposite side thereof, so as to partially surround the semiconductor layer 1a.

As illustrated in the sectional view of FIG. 7, the gate-electrode extending portion 32, which extends from the gate-electrode main portion 31, extends into the channel-region adjacent portion 801a of the contact hole 801. Because of such a light-shielding structure, a part of the gate-electrode extending portion 32 that is formed inside the channel-region adjacent portion 801a of the contact hole 801 makes it possible to at least partially shut off, at each side of the semiconductor layer 1a, an incident light beam that enters and propagates toward the side of the channel region 1a' of the semiconductor layer 1a along a direction indicated by any of arrows P2 shown in FIG. 7.

As shown in the plan view of FIG. 6, the first extending portion 801b of the contact hole 801 extends along a first partial region (i.e., first partial area) 110d of the semiconductor layer 1a. That is, the first extending portion 801b of the contact hole 801 surrounds the first partial area 110d of the semiconductor layer 1a in a shape that resembles an alphabet U. The first partial region 110d is a non-limiting example of "a first partial region" according to an aspect of the invention. The first partial region 110d of the semiconductor layer 1a includes the pixel-electrode-side LDD region 1c and a first connection sub region 1ec of the pixel-electrode-side source/drain region 1e. The first connection sub region 1ec of the pixel-electrode-side source/drain region 1e is a non-limiting example of "a first connecting portion" according to an aspect of the invention. The first connection sub region 1ec of the pixel-electrode-side source/drain region 1e is electrically connected to the lower capacitor electrode 71 via the contact hole 83. As has already been explained earlier, the lower capacitor electrode 71 provides electric relay connection between the pixel-electrode-side source/drain region 1e of the semiconductor layer 1a and the pixel electrode 9a.

As shown in FIGS. 6, 8, and 9, a part of the gate-electrode extending portion 32 is formed in the first extending portion 801b of the contact hole 801 in such a manner that it extends from the aforementioned part of the gate-electrode extending portion 32 that is formed in the channel-region adjacent portion 801a of the contact hole 801. Because of such a light-shielding structure, the above-mentioned part of the gate-electrode extending portion 32 that is formed inside the first extending portion 801b of the contact hole 801 makes it possible to at least partially shut off, at each side of the semiconductor layer 1a, a lateral incident light beam that enters and propagates toward the first partial region 110d of the semiconductor layer 1a along a direction indicated by any of arrows P2 shown in FIGS. 8 and 9.

As shown in the plan view of FIG. 6, the contact hole 801 is formed in such a manner that it extends from one side area adjacent to the channel region 1a' of the semiconductor layer 1a to the other opposite side area adjacent to the channel region 1a' of the semiconductor layer 1a in a circuitous U-shaped extension pattern, as has already been explained above. Accordingly, when viewed in plan over the TFT array substrate 10, the first extending portion 801b of the contact hole 801 is formed around a part of the semiconductor layer 1a so as to partially surround the semiconductor layer 1a. That is, when viewed in plan, the U-shaped first extending portion 801b of the contact hole 801 extends from one side area adjacent to the semiconductor layer 1a to the other opposite side area adjacent thereto so as to surround the first partial region 110d of the semiconductor layer 1a.

Because of such a light-shielding structure, the above-mentioned part of the gate-electrode extending portion 32 that is formed inside the first extending portion 801b of the contact hole 801 makes it possible to at least partially shut off, at each side of the semiconductor layer 1a, an incident light beam that enters and propagates toward the side of the pixel-electrode-side LDD region 1c of the first partial region 110d of the semiconductor layer 1a along a direction indicated by any of the arrows P2 shown in FIG. 8.

As shown in the plan view of FIG. 6, the U-shaped first extending portion 801b of the contact hole 801 extends from one side area adjacent to the semiconductor layer 1a to the other opposite side area adjacent thereto so as to surround the pixel-electrode-side source/drain region 1e of the first partial region 110d of the semiconductor layer 1a. Therefore, the above-mentioned part of the gate-electrode extending portion 32 that is formed inside the first extending portion 801b of the contact hole 801 makes it possible to shut off any lateral incident light beam that enters and propagates toward the side of the pixel-electrode-side source/drain region 1e of the first partial region 110d of the semiconductor layer 1a. Note that a part of the U-shaped first extending portion 801b of the contact hole 801 is formed around the first connection sub region 1ec of the pixel-electrode-side source/drain region 1e of the semiconductor layer 1a. Because of such a light-shielding structure, the above-mentioned part of the gate-electrode extending portion 32 that is formed inside the first extending portion 801b of the contact hole 801 makes it possible to shut off, at each side of the semiconductor layer 1a and throughout a wider light-shielding area, any incident light beam that enters and propagates toward the side of the first connection sub region 1ec of the pixel-electrode-side source/drain region 1e of the first partial region 110d of the semiconductor layer 1a along a direction indicated by any of the arrows P2 shown in FIG. 9.

As has already been described above while referring to FIGS. 6, 7, 8, and 9, the first scanning line 11a, which doubles as a lower light-shielding film, makes it possible to shut off any incident light beam that enters and propagates in the direction indicated by an arrow P1 shown in each of FIGS. 7, 8, and 9 toward the channel region 1a', the data-line-side LDD region 1b, the pixel-electrode-side LDD region 1c, the data-line-side source/drain region 1d, and the pixel-electrode-side source/drain region 1e of the semiconductor layer 1a of the TFT 30 through a lower layer(s) that is formed below the semiconductor layer 1a of the TFT 30.

In the configuration of a liquid crystal device according to the present embodiment of the invention, it is preferable that at least a part of either one of the aforementioned two electrodes that make up the storage capacitor 70 should be made of an electro-conductive material that has light-shielding property. That is, it is preferable that at least a portion of the lower capacitor electrode 71 or a portion of the upper capacitor electrode (i.e., a portion of the aforementioned capacitor line 300) should be made of a conductive material that has light-shielding characteristics. If at least a part of the lower capacitor electrode 71 or a part of the upper capacitor electrode is made of a conductive material that has light-shielding characteristics, it is possible to shut off any incident light beam that enters and propagates in the direction indicated by an arrow P0 shown in each of FIGS. 7, 8, and 9 toward the channel region 1a', the data-line-side LDD region 1b, the pixel-electrode-side LDD region 1c, and the pixel-electrode-side source/drain region 1e of the semiconductor layer 1a of the TFT 30 through upper layers that are formed above the semiconductor layer 1a of the TFT 30. In addition, it is preferable that at least either one of the lower capacitor electrode 71 and the upper capacitor electrode 300 should be formed to cover the first partial region 110d of the semiconductor layer 1a in a plan view. With such a structure, it is possible to shut off, with increased reliability, any incident light beam that enters and propagates in the direction indicated by an arrow P0 shown in each of FIGS. 8 and 9 toward the first partial region 110d that includes the pixel-electrode-side LDD region 1c and the first connection sub region 1ec of the pixel-electrode-side source/drain region 1e of the semiconductor layer 1a of the TFT 30 through upper layers that are formed above the semiconductor layer 1a of the TFT 30.

Therefore, as will be understood from FIG. 7, if the configuration of a liquid crystal device according to the present embodiment of the invention is adopted, it is possible to shut off, or at least substantially reduce, any incident light beam that enters and propagates toward the channel region 1a' of the semiconductor layer 1a of the TFT 30 through a lower layer(s) that is formed below the semiconductor layer 1a thereof in the direction shown by the arrow P1 and through upper layers that are formed above the semiconductor layer 1a thereof in the direction shown by the arrow 20. In addition, the configuration of a liquid crystal device according to the present embodiment of the invention makes it further possible to shut off, or at least substantially reduce, any lateral incident light beam that enters and propagates toward the side of the channel region 1a' of the semiconductor layer 1a along a direction indicated by any of the arrows P2. According to the empirical study conducted by the inventors of the subject application (i.e., present invention), it is found that, at the time of the operation of the TFT 30 having an LDD structure, there is a relatively greater possibility of the occurrence of an optical leakage current in the pixel-electrode-side LDD region 1c than in the data-line-side LDD region 1b as any incident light beam enters and propagates toward the semiconductor layer 1a of the TFT 30. In this respect, as will be understood from FIG. 8, if the configuration of a liquid crystal device according to the present embodiment of the invention is adopted, it is possible to shut off, or at least substantially reduce, any incident light beam that enters and propagates toward the pixel-electrode-side LDD region 1c of the semiconductor layer 1a of the TFT 30 through a lower layer(s) that is formed below the semiconductor layer 1a thereof in the direction shown by the arrow P1 and through upper layers that are formed above the semiconductor layer 1a thereof in the direction shown by the arrow P0. In addition, the configuration of a liquid crystal device according to the present embodiment of the invention makes it further possible to shut off, or at least substantially reduce, any lateral incident light beam that enters and propagates toward the side of the pixel-electrode-side LDD region 1c of the semiconductor layer 1a along a direction indicated by any of the arrows P2. Moreover, as will be understood from FIG. 9, if the configuration of a liquid crystal device according to the present embodiment of the invention is adopted, it is possible to shut off, or at least substantially reduce, any incident light beam that enters and propagates toward the pixel-electrode-side source/drain region 1e of the semiconductor layer 1a of the TFT 30 through a lower layer(s) that is formed below the semiconductor layer 1a thereof in the direction shown by the arrow 21 and through upper layers that are formed above the semiconductor layer 1a thereof in the direction shown by the arrow P0. In addition, the configuration of a liquid crystal device according to the present embodiment of the invention makes it further possible to shut off, or at least substantially reduce, any lateral incident light beam that enters and propagates toward the side of the pixel-electrode-side source/drain region 1e of the semiconductor layer 1a along a direction indicated by any of the arrows P2. As has already been explained above, the first extending portion 801b of the contact hole 801 surrounds the first connection sub region 1ec of the pixel-electrode-side source/drain region 1e of the semiconductor layer 1a in a plan view. With such a structure, it is possible to shut off any incident light beam that could otherwise reach the side of the first connection sub region 1ec of the pixel-electrode-side source/drain region 1e thereof, thereby making it further possible to prevent such light from being irradiated to the pixel-electrode-side LDD region 1c of the semiconductor layer 1a with increased reliability.

Therefore, it is possible to enhance the light-shielding property of a light-shielding structure so as to improve the optical protection of the pixel-electrode-side LDD region 1c, which is relatively more susceptible to an optical leakage current. Therefore, it is further possible to effectively reduce, with increased reliability, an optical leakage current that flows in the TFT 30. As a result thereof, it is possible to avoid any display failure from occurring due to the malfunction of a transistor or due to flickers, though not limited thereto. Thus, a liquid crystal device according to the present embodiment of the invention, which is a non-limiting example of an electro-optical device according to an aspect of the invention, features enhanced display quality.

As has already been explained earlier, a part of the gate-electrode extending portion 32 of the gate electrode 3a is formed inside the contact hole 801. Because of such a structure, it is not necessary to provide any extra/additional light-shielding film other than the gate-electrode extending portion 32 of the gate electrode 3a so as to shut off lateral light that propagates toward the side of the semiconductor layer 1a. Therefore, it is possible to provide an effective light-shielding structure so as to optically protect the TFT 30 without requiring any complex structure. Therefore, in comparison with the light-shielding structure of the aforementioned related art that is described in, for example, JP-A-2003-307725, the above-explained light-shielding structure according to the present embodiment of the invention makes it possible to simplify the manufacturing process of a liquid crystal device.

Figure 10:
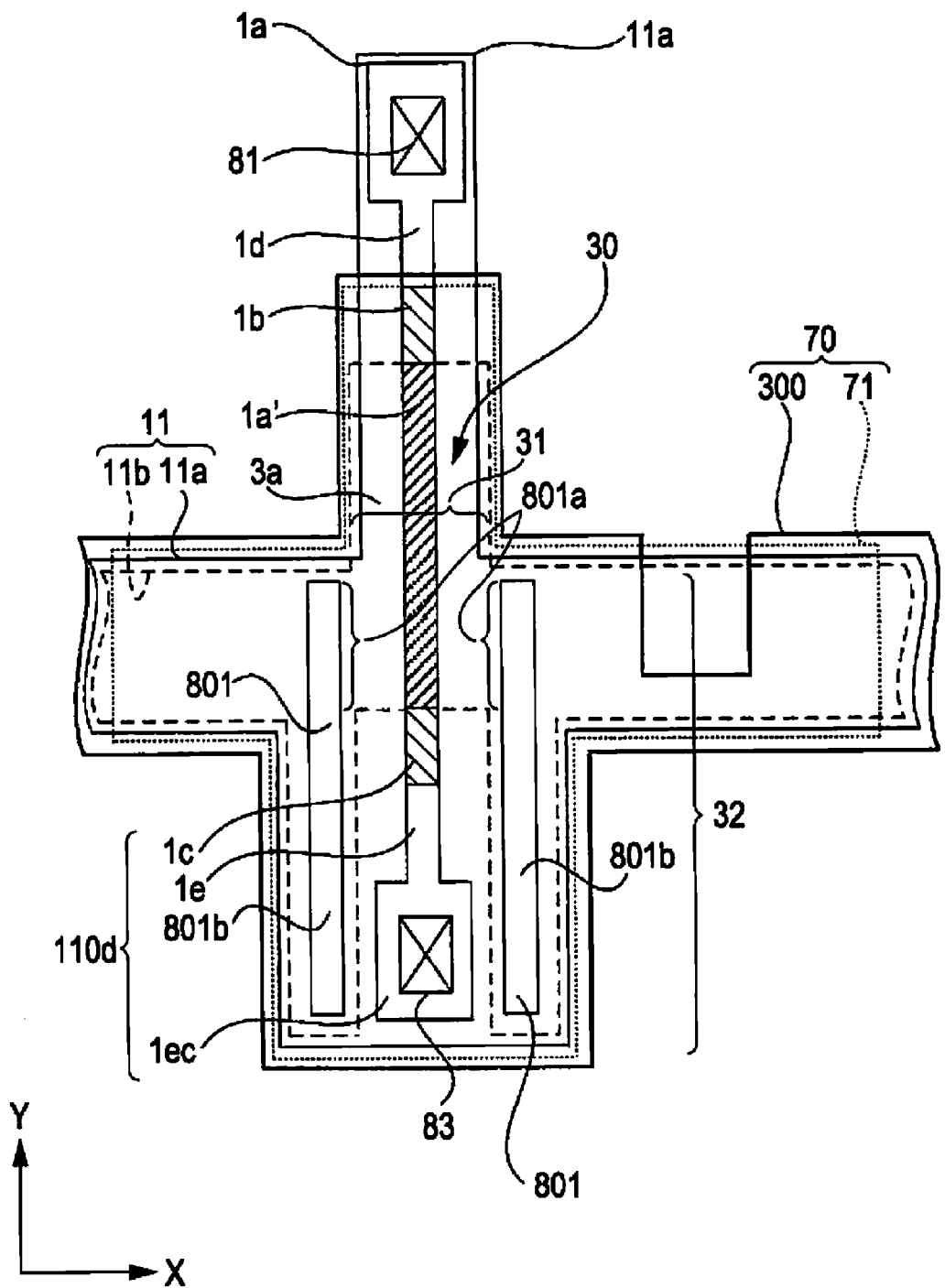
FIG. 10 is a partial plan view that schematically illustrates, in a two-dimensional layout, a non-limiting modification example of the partial lamination structure of a pixel unit according to the first exemplary embodiment of the invention explained above, or more specifically, the first layer, the second layer, and the third layer thereof.

The planar shape of the first extending portion 801b of the contact hole 801 explained above may be modified as follows. FIG. 10 is a partial plan view that schematically illustrates, in a two-dimensional layout, a non-limiting modification example of the partial lamination structure of a pixel unit according to the first exemplary embodiment of the invention explained above, or more specifically, the first layer, the second layer, and the third layer thereof.

As illustrated in the plan view of FIG. 10, the first extending portion 801b of the contact hole 801 according to the modification example described herein is formed in such a manner that it extends from the channel-region adjacent portion 801a thereof along the first partial region 110d of the semiconductor layer 1a at each side of the semiconductor layer 1a. The unique structure of the first extending portion 801b of the contact hole 801 according to this modification example can be specifically described as follows. In the two-dimensional layout of a light-shielding structure according to the foregoing first exemplary embodiment of the invention, which is explained while referring to FIG. 6, the U-shaped first extending portion 801b of the contact hole 801 extends from one side area adjacent to the semiconductor layer 1a to the other opposite side area adjacent thereto so as to surround the first partial region 110d of the semiconductor layer 1a. Unlike such a U-shaped light-shielding structure according to the foregoing first exemplary embodiment of the invention, the first extending portion 801b of the contact hole 801 according to the modification example described herein is split into two parts when viewed in plan, each of which is formed at the corresponding side of the semiconductor layer 1a. Even when the planar structure of the first extending portion 801b of the contact hole 801 is modified as explained above, the aforementioned part of the gate-electrode extending portion 32 that is formed inside the first extending portion 801b of the contact hole 801 makes it possible to at least partially shut off, at each side of the semiconductor layer 1a, an incident light beam that enters and propagates toward the side of the pixel-electrode-side LDD region 1c of the first partial region 110d of the semiconductor layer 1a as well as toward the side of the pixel-electrode-side source/drain region 1e of the first partial region 110d of the semiconductor layer 1a.

In addition, in a light-shielding structure according to this modification example, the partial length of the non-main-line extending portion of each of the first scanning line 11a and the second scanning line 11b that extends in the Y direction along the first partial region 110d of the semiconductor layer 1a from the X-directional main line portion thereof is shorter than that of a light-shielding structure according to the foregoing first exemplary embodiment of the invention, which is explained while referring to FIG. 6. Because of such a shorter first-partial-region-adjacent length of each of the first scanning line 11a and the second scanning line 11b, it is possible to increase the size of the open area/region of each pixel unit. Therefore, the modified light-shielding structure explained above makes it possible to achieve a higher numerical aperture (i.e., opening ratio) of each pixel.

Second Embodiment

Figure 11:
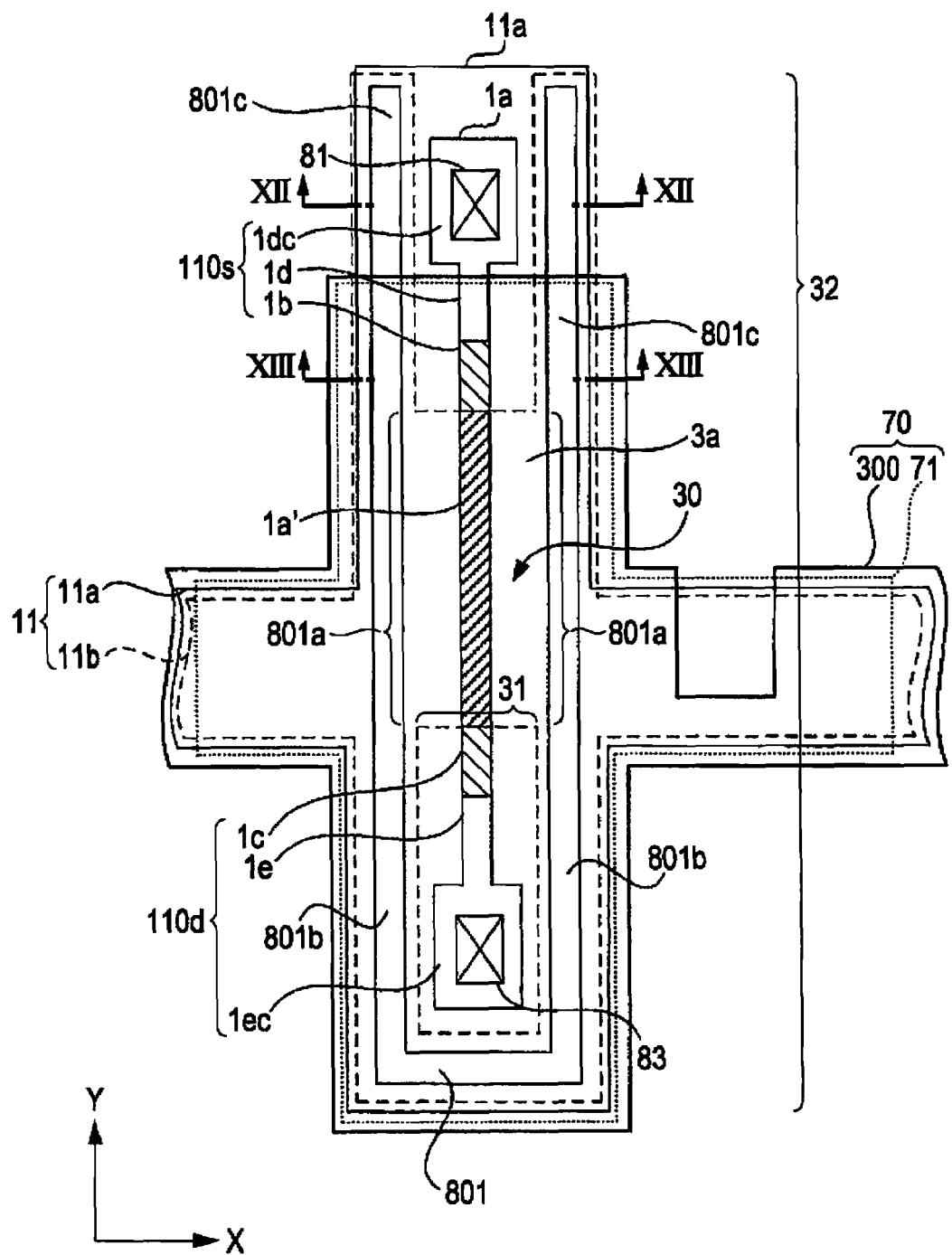
FIG. 11 is a partial plan view that schematically illustrates, in a two-dimensional layout, an example of the partial lamination structure of a pixel unit according to the second exemplary embodiment of the invention, or more specifically, the first layer, the second layer, and the third layer thereof.
Figure 12:
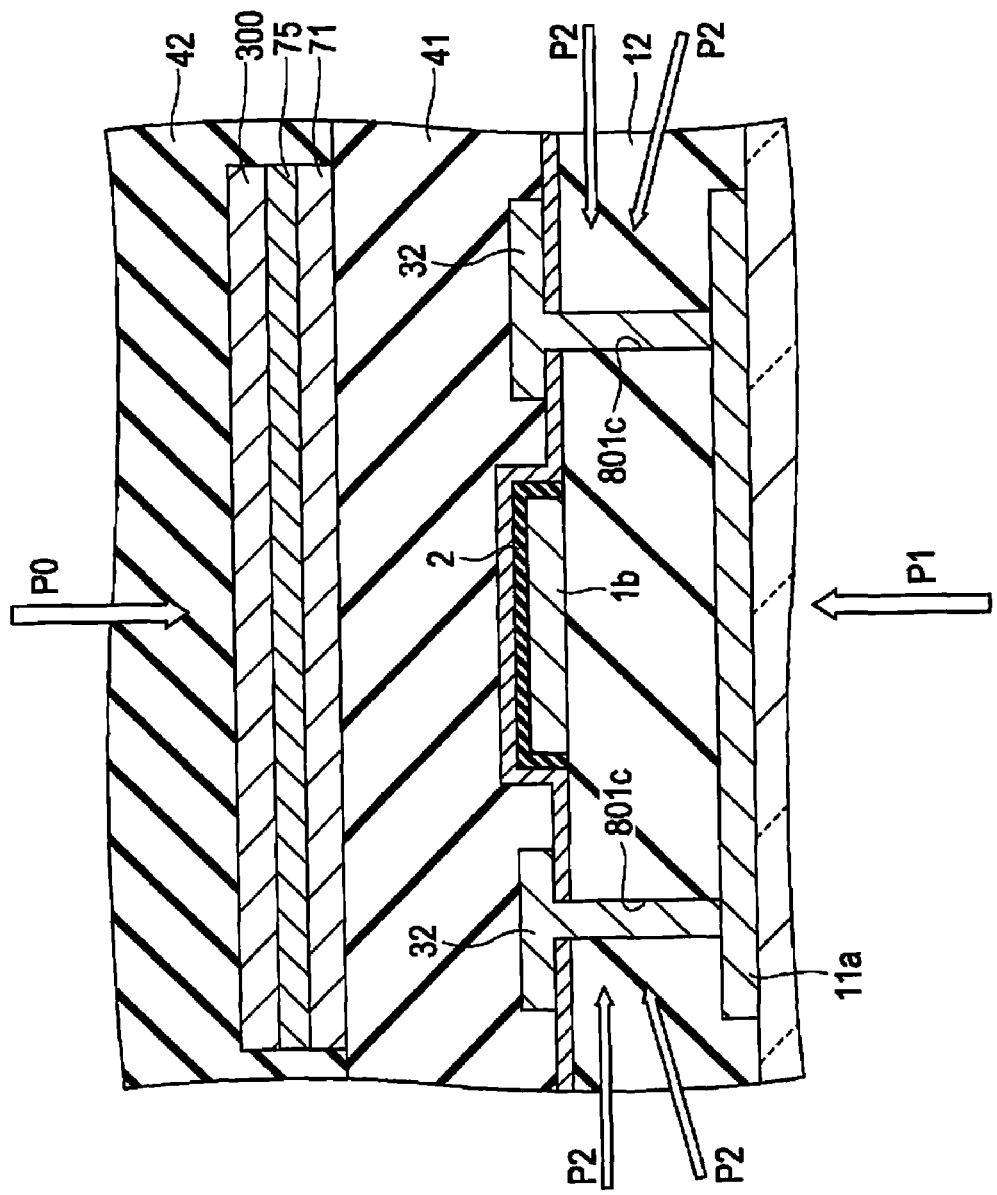
FIG. 12 is a sectional view taken along the line XII-XII of FIG. 11.
Figure 13:
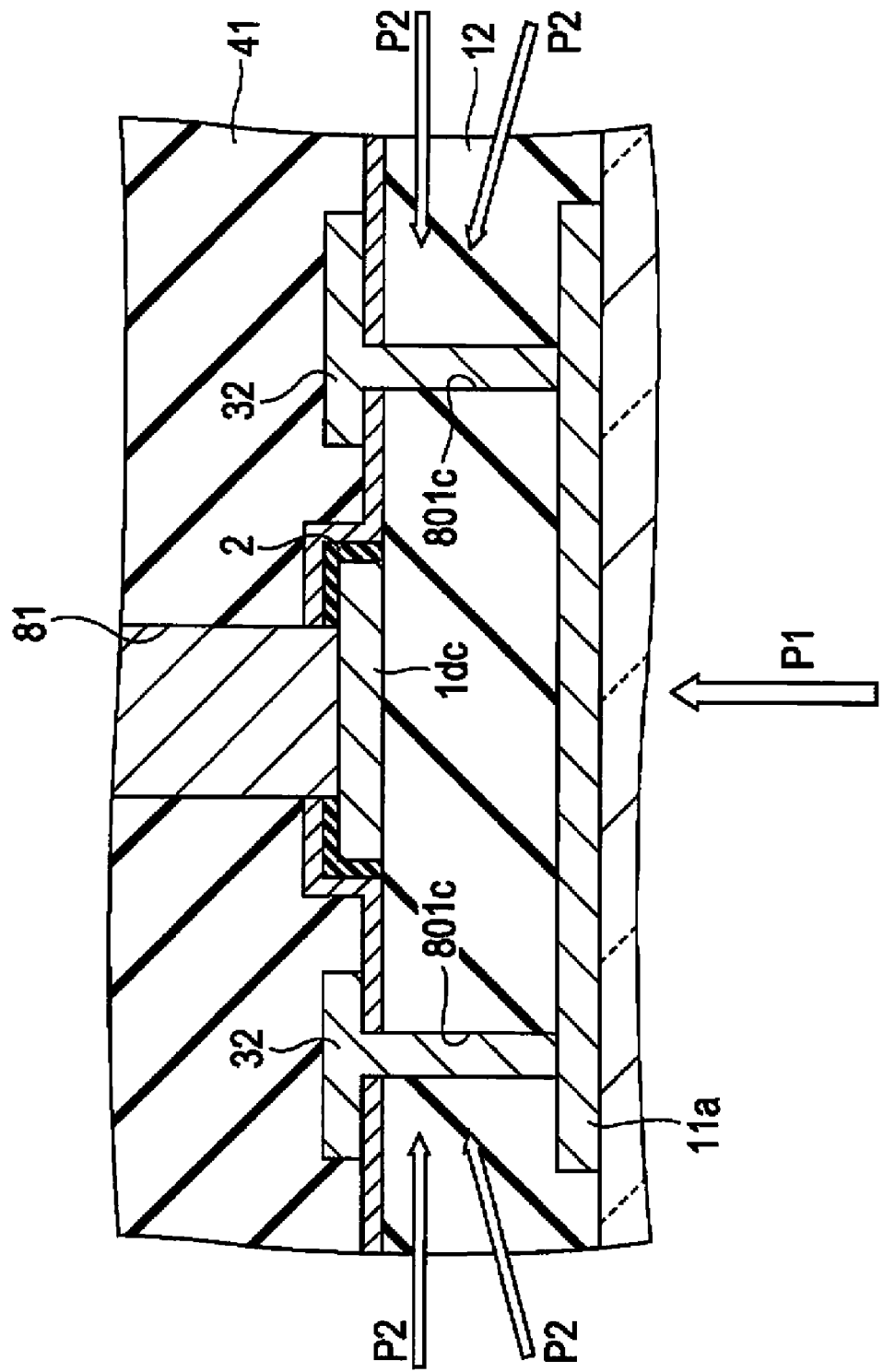
FIG. 13 is a sectional view taken along the line XIII-XIII of FIG. 11.

With reference to FIGS. 11, 12, and 13, a liquid crystal device according to a second exemplary embodiment of the invention is explained below.

The configuration of a liquid crystal device according to the second exemplary embodiment of the invention explained below differs from the configuration of a liquid crystal device according to the first exemplary embodiment of the invention explained above in that the contact hole 801 according to the second exemplary embodiment of the invention has a second extending portion(s) 801c in addition to the first extending portion 801b explained above. In the following description of a liquid crystal device according to the second embodiment of the invention, differences in the layer/lamination structure thereof from that of the liquid crystal device according to the first embodiment of the invention described above are mainly explained while making reference to FIGS. 11-13 as well as the above-referenced FIGS. 1-6. Therefore, in the following description of the liquid crystal device according to the second embodiment of the invention, the same reference numerals are consistently used for the same components as those of the liquid crystal device according to the first embodiment of the invention so as to omit, if appropriate, any redundant explanation or simplify explanation thereof.

FIG. 11 is a partial plan view that schematically illustrates, in a two-dimensional layout, an example of the partial lamination structure of a pixel unit according to the second exemplary embodiment of the invention, or more specifically, the first layer, the second layer, and the third layer thereof. FIG. 12 is a sectional view taken along the line XII-XII of FIG. 11. FIG. 13 is a sectional view taken along the line XIII-XIII of FIG. 11.

In the configuration of a liquid crystal device according to the present embodiment of the invention, as illustrated in the plan view of FIG. 11, the contact hole 801, which is formed through the underlying insulation film 12, is elongated along each side of the semiconductor layer 1a in such a manner that it extends from the channel-region adjacent portion 801a thereof toward the data-line connection side thereof, which is electrically connected to the data line 6a. Note that the data-line connection side of the semiconductor layer 1a is posi- tioned at the other Y-directional side that is opposite to the first-extending-portion (801b) side thereof as viewed from the channel-region adjacent portion 801a thereof. Specifically, the contact hole 801 according to the second exemplary embodiment of the invention has the first extending portion 801b explained in the foregoing first exemplary embodiment of the invention, which extends from the channel-region adjacent portion 801a thereof in one Y direction and further has the second extending portion 801c, which extends from the channel-region adjacent portion 801a thereof in the other opposite Y direction. The second extending portion 801c of the contact hole 801 is formed in such a manner that it extends from the channel-region adjacent portion 801a thereof along a second partial region 110s of the semiconductor layer 1a at each side of the semiconductor layer 1a. The second partial region 110s is a non-limiting example of "a second partial region" according to an aspect of the invention. The second partial region 110s of the semiconductor layer 1a includes the data-line-side LDD region 1b and a second connection sub region 1dc of the data-line-side source/drain region 1d. The second connection sub region 1dc of the data-line-side source/drain region 1d is a non-limiting example of "a second connecting portion" according to an aspect of the invention. The second connection sub region 1dc of the data-line-side source/drain region 1d is electrically connected to the data line 6a via the contact hole 81.

As shown in FIG. 11, the gate-electrode extending portion 32 of the gate electrode 3a, which extends from the gate-electrode main portion 31 thereof, extends throughout the second extending portion 801c, the channel-region adjacent portion 801a, and the first extending portion 801b in a plan view. Note that the gate-electrode extending portion 32 of the gate electrode 3a extends from the channel-region adjacent portion 801a of the contact hole 801 to each end of the second extending portion 801c thereof in the configuration of a liquid crystal device according to the present embodiment of the invention. Because of such a light-shielding structure, the above-mentioned part of the gate-electrode extending portion 32 that is formed inside the second extending portion 801c of the contact hole 801 makes it possible to at least partially shut off, at each side of the semiconductor layer 1a, a lateral incident light beam that enters and propagates toward the second partial region 10s of the semiconductor layer 1a.

That is, the above-mentioned part of the gate-electrode extending portion 32 that is formed inside the second extending portion 801c of the contact hole 801 makes it possible to at least partially shut off, at each side of the data-line-side LDD region 1b of the semiconductor layer 1a, an incident light beam that enters and propagates toward the side of the data-line-side LDD region 1b of the second partial region 110s of the semiconductor layer 1a along a direction indicated by any of arrows P2 shown in FIG. 12.

In addition, the above-mentioned part of the gate-electrode extending portion 32 that is formed inside the second extending portion 801c of the contact hole 801 makes it possible to at least partially shut off, at each side of the data-line-side source/drain region 1d of the semiconductor layer 1a, an incident light beam that enters and propagates toward the side of the data-line-side source/drain region 1d of the second partial region 110s of the semiconductor layer 1a along a direction indicated by any of arrows P2 shown in FIG. 13. As has already been explained above, in the configuration of a liquid crystal device according to the present embodiment of the invention, the second extending portion(s) 801c of the contact hole 801 extends along the second partial region 110s of the semiconductor layer 1a through an end region(s) adjacent to the second connection sub region 1dc of the data-lineside source/drain region 1d. With such a structure, it is possible to at least partially shut off, at each side of the semiconductor layer 1a, a lateral incident light beam that enters and propagates toward the second connection sub region 1dc of the data-line-side source/drain region 1d.

As explained above, in the configuration of a liquid crystal device according to the second exemplary embodiment of the invention, the contact hole 801 has a second extending portion(s) 801c in addition to the first extending portion 801b. Because of such a light-shielding structure, the above-mentioned part of the gate-electrode extending portion 32 that is formed inside the second extending portion 801c of the contact hole 801 makes it possible to shut off or substantially reduce, at each side of the semiconductor layer 1a, a lateral incident light beam that enters and propagates toward the second partial region 110s of the semiconductor layer 1a, which includes the data-line-side LDD region 1b and the second connection sub region 1dc of the data-line-side source/drain region 1d.

In addition, in the configuration of a liquid crystal device according to the second exemplary embodiment of the invention explained above, the first extending portion 801b of the contact hole 801 is formed in such a manner that it extends from the channel-region adjacent portion 801a thereof in one Y direction whereas the second extending portion 801c thereof is formed in such a manner that it extends from the channel-region adjacent portion 801a thereof in the other opposite Y direction. Therefore, the above-mentioned part of the gate-electrode extending portion 32 that is formed inside each of the channel-region adjacent portion 801a, the first extending portion 801b, and the second extending portion 801c of the contact hole 801 makes it possible to shut off, at each side of the semiconductor layer 1a and throughout a wider light-shielding area, a lateral incident light beam that enters and propagates toward the side of the semiconductor layer 1a. Therefore, it is possible to shut off or substantially reduce, at each side of the semiconductor layer 1a, a lateral incident light beam that enters and propagates toward the side of the semiconductor layer 1a.

Figure 14:
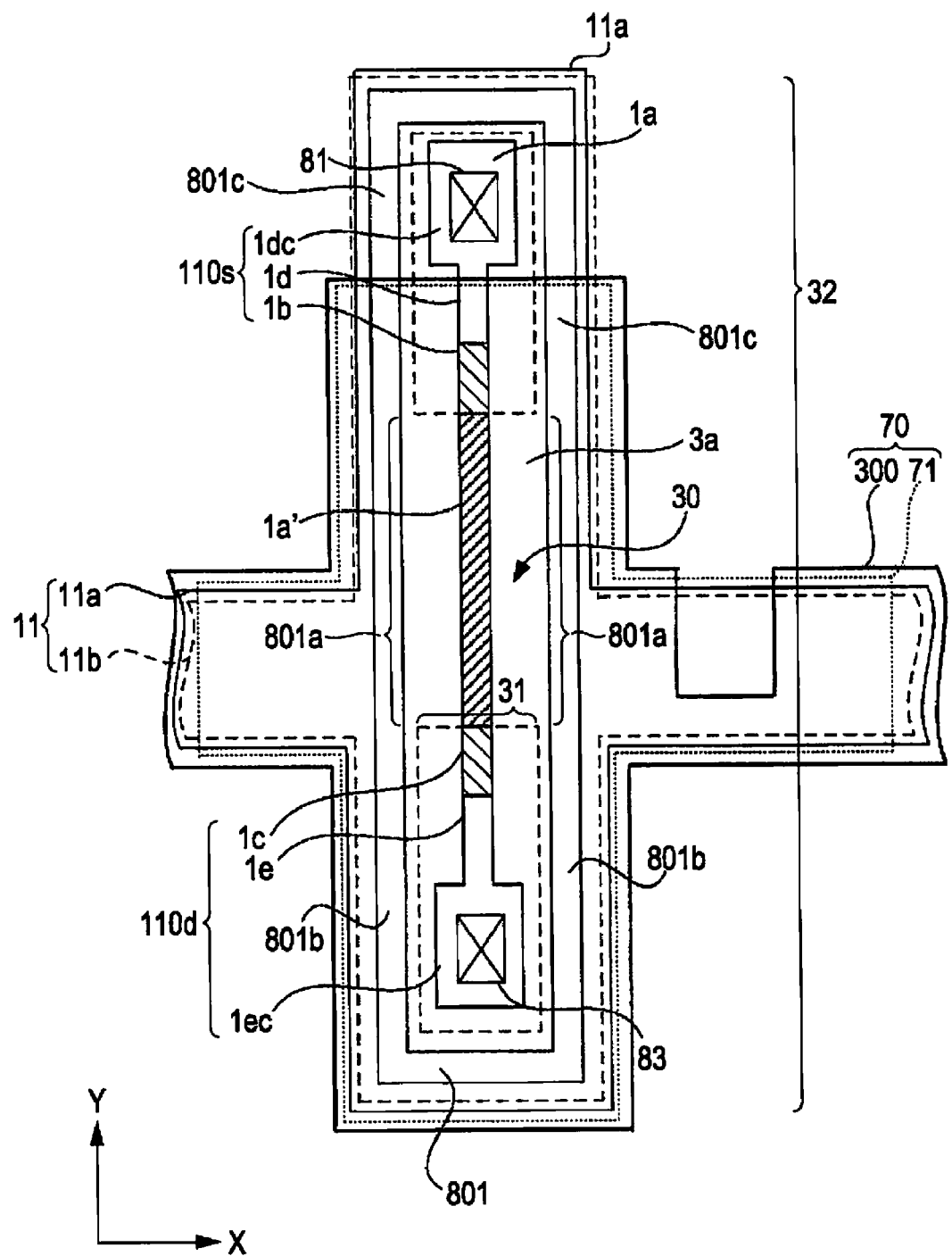
FIG. 14 is a partial plan view that schematically illustrates, in a two-dimensional layout, a non-limiting modification example of the partial lamination structure of a pixel unit according to the second exemplary embodiment of the invention explained above, or more specifically, the first layer, the second layer, and the third layer thereof.

The planar shape of the second extending portion 801c of the contact hole 801 according to the second exemplary embodiment of the invention explained above may be modified as follows. FIG. 14 is a partial plan view that schematically illustrates, in a two-dimensional layout, a non-limiting modification example of the partial lamination structure of a pixel unit according to the second exemplary embodiment of the invention explained above, or more specifically, the first layer, the second layer, and the third layer thereof.

As illustrated in the plan view of FIG. 14, the contact hole 801 is formed in an "elongated O-shaped" extension pattern. Accordingly, when viewed in plan over the TFT array substrate 10, the "reverse U-shaped" second extending portion 801c of the contact hole 801 extends from one side area adjacent to the semiconductor layer 1a to the other opposite side area adjacent thereto so as to substantially surround the second partial region 110s of the semiconductor layer 1a. Therefore, the aforementioned part of the gate-electrode extending portion 32 that is formed inside the second extending portion 801c of the contact hole 801 makes it possible to shut off any lateral incident light beam that enters and propagates toward the side of the data-line-side source/drain region 1d of the second partial region 110s of the semiconductor layer 1a. Note that a part of the reverse U-shaped second extending portion 801c of the contact hole 801 is formed around the second connection sub region 1dc of the data-line-side source/drain region 1d of the semiconductor layer 1a. With such a structure, it is possible to shut off any incident light beam that could otherwise reach the side of the second connection sub region 1dc of the data-line-side source/drain region 1d thereof throughout a wider light-shielding area, thereby offering enhanced light-shielding protection in a reliable manner.

Electronic Apparatus

Next, an explanation is given of an example of the applications of a liquid crystal device described above, which is a non-limiting example of an electro-optical device according to an aspect of the invention, to various kinds of electronic apparatuses. FIG. 15 is a plan view that schematically illustrates an example of the configuration of a projector. In the following description, an explanation is given of a projector that employs the above-described liquid crystal device as a light valve.

As illustrated in FIG. 15, a lamp unit 1102, which is made of a white light source such as a halogen lamp, is provided in a projector 1100. A projection light beam that is emitted from the lamp unit 1102 is separated into three primary color components of R, G, and B by four mirrors 1106 and two dichroic mirrors 1108 arranged in a light guide 1104. The separated primary color components of R, G, and B enter liquid crystal panel 1110R, 1110G, and 1110B, respectively, which function as light valves corresponding to the respective primary color components.

The configuration of the liquid crystal panel 1110R, 1110G, or 1110B is the same as or similar to that of the liquid crystal device described above. Each of these liquid crystal panels 1110R, 1110G, and 1110B is driven by the corresponding one of the primary color signals R, G, and B, which are supplied from an image signal processing circuit. Light subjected to optical modulation by one of these liquid crystal panels enters a dichroic prism 1112 from the corresponding one of three directions. Light of R color component and light of B color component are refracted at a 90-degree angle at the dichroic prism 1112, whereas light of G color component goes straight through the dichroic prism 1112. Therefore, as a result of combination of these color components, a color image is projected on a screen, etc., through a projection lens 1114.

Among a variety of electronic apparatuses to which the electro-optical device according to an aspect the invention could be embodied are, in addition to the electronic apparatus (projector) explained above with reference to FIG. 15, a mobile-type personal computer, a mobile phone, a liquid crystal display television, a viewfinder-type video recorder, a video recorder of a direct monitor view type, a car navigation device, a pager, an electronic personal organizer, an electronic calculator, a word processor, a workstation, a videophone, a POS terminal, a touch-panel device, and so forth. Needless to say, the invention is also applicable to these various electronic apparatuses without any limitation to those enumerated/mentioned above.

In addition to the liquid crystal device explained in the exemplary embodiments described above, the invention is also applicable to a reflective liquid crystal display which has elements formed on a silicon substrate (LCOS, liquid crystal on silicon), though not limited thereto.

The present invention should be in no case interpreted to be limited to the specific embodiments described above. The invention may be modified, altered, changed, adapted, and/or improved within a range not departing from the gist and/or spirit of the invention apprehended by a person skilled in the art from explicit and implicit description given herein as well as recitation of appended claims. An electro-optical device subjected to such modification, alteration, change, adaptation, and/or improvement and an electronic apparatus that is provided with such an electro-optical device are also within the technical scope of the invention.

The entire disclosure of Japanese Patent Application No. 2007-233696, filed Sep. 10, 2007 is expressly incorporated by reference herein.

What is claimed is:

1. An electro-optical device comprising:
   a data line and a scanning line that intersect with each other;
   a pixel electrode which is formed at a position corresponding to an intersection formed by the data line and the scanning line;
   an interlayer insulation film including a contact hole; and
   a transistor which includes a semiconductor film and a gate electrode, the semiconductor film being separated from the scanning line by the interlayer insulation film, the semiconductor film having a channel region, a data-line-side source/drain region that is electrically connected to the data line, a pixel-electrode-side source/drain region that is electrically connected to the pixel electrode, a first junction region that is formed between the channel region and the data-line-side source/drain region, and a second junction region that is formed between the channel region and the pixel-electrode-side source/drain region, the semiconductor film comprising a first partial region including the second junction region and a first connecting portion of the pixel-electrode-side source/drain region, the first connecting portion of the pixel-electrode-side source/drain region being electrically connected to the pixel electrode, the gate electrode being a greater distance from the scanning line than from the semiconductor film, the gate electrode overlapping the channel region, the gate electrode being electrically connected to the scanning line through the contact hole in the interlayer insulation film,
   the contact hole has a channel-region adjacent portion next to the channel region of the semiconductor film and has a first extending portion that extends from the channel-region adjacent portion along the first partial region of the semiconductor film when viewed in plan.

2. The electro-optical device according to claim 1, wherein, when viewed in plan, the first extending portion of the contact hole extends from one side area adjacent to the semiconductor film to the other opposite side area adjacent to the semiconductor film so as to substantially surround the first partial region of the semiconductor film.

3. The electro-optical device according to claim 1, wherein the gate electrode has a gate-electrode main portion that overlaps the channel region of the semiconductor film and a gate-electrode extending portion that extends from the gate-electrode main portion in such a manner that a part of the gate-electrode extending portion of the gate electrode is formed inside the contact hole.

4. The electro-optical device according to claim 1, wherein the contact hole has, in addition to the channel-region adjacent portion and the first extending portion, a second extending portion that extends from the channel-region adjacent portion along a second partial region of the semiconductor film when viewed in plan; the second partial region of the semiconductor film includes the first junction region and a second connecting portion of the data-line-side source/drain region; and the second connecting portion of the data-line-side source/drain region is electrically connected to the data line.

5. The electro-optical device according to claim 4, wherein, when viewed in plan, the second extending portion is formed next to the semiconductor film at each side thereof.

6. The electro-optical device according to claim 5, wherein, when viewed in plan, the second extending portion of the contact hole extends from one side area adjacent to the semiconductor film to the other opposite side area adjacent to the semiconductor film so as to substantially surround the second partial region of the semiconductor film.

7. The electro-optical device according to claim 1, further comprising a plurality of storage capacitors each of which has a lower capacitor electrode and an upper capacitor electrode that are formed opposite to each other with a dielectric film being interposed between the lower capacitor electrode and the upper capacitor electrode, wherein the storage capacitor is formed at a layer different from the layer of the transistor at a gate-electrode formation side as viewed from the semiconductor film.

8. The electro-optical device according to claim 7, wherein at least one of the lower capacitor electrode and the upper capacitor electrode is made of an electro-conductive material having light-shielding property.

9. The electro-optical device according to claim 8, wherein at least one of the lower capacitor electrode and the upper capacitor electrode at least partially covers the first partial region.

10. An electronic apparatus that is provided with the electro-optical device according to claim 1.

* * * * *